United States Patent
Kang et al.

(10) Patent No.: US 8,253,467 B2
(45) Date of Patent: Aug. 28, 2012

(54) PHASE SIGNAL GENERATING APPARATUSES

(75) Inventors: ByoungJoong Kang, Kwaseong-si (KR); SangSoo Ko, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 100 days.

(21) Appl. No.: 12/820,527

(22) Filed: Jun. 22, 2010

(65) Prior Publication Data

US 2011/0006826 A1 Jan. 13, 2011

(30) Foreign Application Priority Data

Jul. 7, 2009 (KR) ........................ 10-2009-0061740

(51) Int. Cl.
*H03H 11/16* (2006.01)

(52) U.S. Cl. .................. 327/254; 327/237; 327/238

(58) Field of Classification Search .................. None
See application file for complete search history.

(56) References Cited

U.S. PATENT DOCUMENTS

| 5,945,860 | A * | 8/1999 | Guay et al. | 327/246 |
| 7,301,383 | B2 * | 11/2007 | Suzuki | 327/237 |
| 7,928,789 | B2 * | 4/2011 | Freyman et al. | 327/231 |

| 2004/0169561 | A1 | 9/2004 | Cho |
| 2005/0281356 | A1 | 12/2005 | Kim |
| 2006/0009171 | A1 | 1/2006 | Xu et al. |

FOREIGN PATENT DOCUMENTS

| JP | 2000-101668 A | 4/2000 |
| KR | 10-0498490 | 9/2004 |
| KR | 10-0551481 | 12/2005 |

* cited by examiner

*Primary Examiner* — An Luu
(74) *Attorney, Agent, or Firm* — Harness, Dickey & Pierce, P.L.C.

(57) ABSTRACT

In at least one example embodiment, a phase signal generating apparatus includes a phase signal generator and phase controller. The phase signal generator is configured to receive a plurality of first phase signals and a plurality of second phase signals, adjust a phase difference between the plurality of first phase signals and the plurality of second phase signals and generate a plurality of adjusted first phase signals and a plurality of adjusted second phase signals, based on a switch control signal and a phase control signal, a phase difference between the plurality of adjusted first phase signals and the plurality of adjusted second phase signals being the adjusted phase difference. The phase controller is configured to generate the switch control signal and the phase control signal based on phase information for the plurality of first phase signals and the plurality of second phase signals.

10 Claims, 8 Drawing Sheets

S2, S3, S6, S7 : ON
S1, S4, S5, S8 : OFF

S1, S4, S6, S7 : ON
S2, S3, S5, S8 : OFF

S2, S3, S5, S8 : ON
S1, S4, S6, S7 : OFF

PHASE SIGNAL GENERATING APPARATUSES

CROSS-REFERENCE TO RELATED APPLICATIONS

This U.S. non-provisional patent application claims priority under 35 U.S.C. §119 to Korean Patent Application No. 10-2009-0061740, filed on Jul. 7, 2009, the entire contents of which are hereby incorporated by reference.

BACKGROUND

The present disclosure herein relates to a communication system, and more particularly, to phase signal generating apparatuses, which can control a phase.

Generally, in a communication system, phase imbalance deteriorates the performance of a transmitter-receiver.

The transmitter-receiver uses an in-phase (I) signal and a quadrature phase (Q) signal for transmitting/receiving a signal. The in-phase signal and the quadrature phase signal have a 90-degree phase difference therebetween.

The transmitter-receiver generates an in-phase signal and a quadrature phase signal through an oscillator. The transmitter-receiver mixes the in-phase signal and the quadrature phase signal with a transmission signal through a mixer. The transmitter-receiver also mixes the in-phase signal and the quadrature phase signal with a reception signal through a mixer. In this way, the transmitter-receiver up-converts the transmission signal or down-converts the reception signal with the in-phase signal and the quadrature phase signal for transmitting/receiving a signal.

Phase imbalance is caused by a sum of a phase imbalance of the oscillator and a phase imbalance of the mixer. Because an in-phase signal and a quadrature phase signal that are generated in the oscillator do not have a 90-degree phase deviation. By symmetrically designing an in-phase signal mixer and a quadrature phase signal mixer, phase imbalance can be reduced. However, phase imbalance is inevitably caused by parasitic components that are generated when actually fabricating the mixer. This phase imbalance decreases a Signal to Noise Ratio (SNR) and thus increases a Bit Error Rate (BER), thereby degrading the performance of a transmitter-receiver.

SUMMARY

The present disclosure provides a phase signal generating apparatus, which controls a phase between phase signals.

The present disclosure also provides a phase signal generating apparatus, which compensates phase imbalance.

The present disclosure also provides a phase signal generating apparatus, which controls the rotation phase angle of phase signals.

Example embodiments of inventive concepts provide a phase signal generating apparatus including a phase signal generator and phase controller. The phase signal generator is configured to receive a plurality of first phase signals and a plurality of second phase signals, adjust a phase difference between the plurality of first phase signals and the plurality of second phase signals and generate a plurality of adjusted first phase signals and a plurality of adjusted second phase signals, based on a switch control signal and a phase control signal, a phase difference between the plurality of adjusted first phase signals and the plurality of adjusted second phase signals being the adjusted phase difference. The phase controller is configured to generate the switch control signal and the phase control signal based on phase information for the plurality of first phase signals and the plurality of second phase signals.

In at least some example embodiments, the phase signal generator may include a switch unit configured to selectively apply the plurality of second phase signals in response to the switch control signal, a phase control unit configured to receive the selectively applied plurality of second phase signals, control magnitudes of the selectively applied plurality of second phase signals and generate a plurality of third phase signals in response to the phase control signal and the selectively applied plurality of second phase signals, and a phase buffer configured to mix the plurality of first phase signals with the plurality of third phase signals and output the plurality of adjusted first phase signals based on the mixed plurality of first phase signals and plurality of third phase signals. The plurality of adjusted first phase signals has a 90-degree phase difference with respect to the plurality of adjusted second phase signals.

In other example embodiments, the second phase signals may be a first positive quadrature phase signal and a first negative quadrature phase signal when the first phase signals are a first positive in-phase signal and a first negative in-phase signal, and the second phase signals may be the first positive in-phase signal and the first negative in-phase signal when the first phase signals are the first positive quadrature phase signal and the first negative quadrature phase signal.

In still other example embodiments, the switch unit may include a first switch unit and a second switch unit. The first switch unit may include a first switch configured to selectively apply a first positive quadrature phase signal to be mixed with a first positive in-phase signal in response to the switch control signal, a second switch configured to selectively apply a first positive quadrature phase signal to be mixed with a first negative in-phase signal in response to the switch control signal, a third switch configured to selectively apply a first negative quadrature phase signal to be mixed with a first positive in-phase signal in response to the switch control signal, and a fourth switch configured to selectively apply a first negative quadrature phase signal to be mixed with a first negative in-phase signal in response to the switch control signal. The second switch unit may include a fifth switch configured to selectively apply the first positive in-phase signal to be mixed with the first positive quadrature phase signal in response to the switch control signal, a sixth switch configured to selectively apply the first positive in-phase signal to be mixed with the first negative in-phase signal in response to the switch control signal, seventh switch configured to selectively apply the first negative in-phase signal to be mixed with the first positive quadrature phase signal in response to the switch control signal, and an eighth switch configured to selectively apply the first negative in-phase signal to be mixed with the first positive in-phase signal in response to the switch control signal In even other example embodiments, the phase control unit may include a first phase control unit and a second phase control unit. Herein, the first phase control unit may include a first variable current source configured to output a current in response to the phase control signal, a first NMOS transistor having a gate connected to the first and third switches, the first NMOS transistor being configured to generate, based on the current output by the first variable current source, a second positive quadrature phase signal if the first NMOS transistor receives the first positive quadrature phase signal and a second negative quadrature phase signal if the first NMOS transistor receives the first negative quadrature phase signal, and a second NMOS transistor having a gate connected to the second and fourth switches, the second NMOS transistor being configured to generate, based on the current output by the first variable current source, the second positive quadrature phase signal if the second NMOS transistor receives the first positive quadrature phase signal and the second negative quadrature phase signal if the second NMOS transistor receives the first negative quadrature phase signal. The second phase control unit may include a second variable current source configured to output a current in response to the phase control signal, a third NMOS transistor having a gate connected to the fourth and seventh switches, the third NMOS transistor being configured to generate, based on the current output by the second variable current source, a second positive in-phase signal if the third NMOS transistor receives the first positive in-phase signal and a second negative in-phase signal if the third NMOS transistor receives the first negative in-phase signal, and a fourth NMOS transistor having a gate connected to the fifth and eighth switches, the fourth NMOS transistor being configured to generate, based on the current output by the second variable current source, the second positive in-phase signal if the fourth NMOS transistor receives the first positive in-phase signal and the second negative quadrature phase signal if the fourth NMOS transistor receives the first negative quadrature phase signal.

In yet other example embodiments, the phase buffer may include an in-phase buffer and a quadrature phase buffer. Herein, the in-phase buffer may include a first path system and a second path system. The first path system is configured to mix the first positive in-phase signal with one of the second positive quadrature phase signal and the second negative quadrature phase signal and configured to generate a third positive in-phase signal based on the first positive in-phase signal and the one of the second positive quadrature phase signal and the second negative quadrature. The second path system is configured to mix the first negative in-phase signal with one of the second positive quadrature phase signal and the second negative quadrature phase signal and configured to generate a third negative in-phase signal based on the first negative in-phase signal and the one of the second positive quadrature phase signal and the second negative quadrature phase signal. The quadrature phase buffer may include a third path system configured to mix the first positive quadrature phase signal with one of the second positive in-phase signal and the second negative in-phase signal and configured to generate a third positive quadrature phase signal based on the first positive quadrature phase signal and the one of the second positive in-phase signal and the second negative in-phase signal, and a fourth path system configured to mix the first negative quadrature phase signal with one of the second positive in-phase signal and the second negative in-phase signal and configured to generate a third negative quadrature phase signal based on the first negative quadrature phase signal and the one of the second positive in-phase signal and the second negative in-phase signal.

In still further example embodiments, the phase signal generator is configured to activate the first switch, the fourth switch, the sixth switch and the seventh switch based on the switch control signal, control a phase difference between the third positive in-phase signal and the third positive quadrature phase signal to be less than 90 degrees based on the switch control signal, and control a phase difference between the third negative in-phase signal and the third negative quadrature phase signal to be less than 90 degrees based on the switch control signal.

In at least some example embodiments, the phase signal generator is configured to activate the second switch, the third switch, the sixth switch and the seventh switch based on the switch control signal, control a phase difference between the third positive in-phase signal and the third positive quadrature phase signal to be greater than 90 degrees based on the switch control signal, and control a phase difference between the third negative in-phase signal and the third negative quadrature phase signal to be greater than 90 degrees based on the switch control signal.

In even further example embodiments, the phase signal generator is configured to activate the first switch, the fourth switch, the sixth switch and the seventh switch based on the switch control signal, and control a phase difference between each of the third positive in-phase signal, the third positive quadrature phase signal, the third negative in-phase signal and the third negative quadrature phase signal to be 90 degrees and to be rotated left with respect to an in-phase axis based on the switch control signal.

In yet further example embodiments, the phase signal generator is configured to activate the second switch, the third switch, the fifth switch and the eighth switch based on the switch control signal, and control a phase difference between each of the third positive in-phase signal, the third positive quadrature phase signal, the third negative in-phase signal and the third negative quadrature phase signal to be 90 degrees and to be rotated right with respect to a quadrature phase axis based on the switch control signal.

BRIEF DESCRIPTION OF THE DRAWINGS

The accompanying drawings are included to provide a further understanding of inventive concepts, and are incorporated in and constitute a part of this specification. The drawings illustrate example embodiments of inventive concepts and, together with the description, serve to explain principles of inventive concepts. In the drawings.

DETAILED DESCRIPTION OF EXAMPLE EMBODIMENTS

Figure 1:
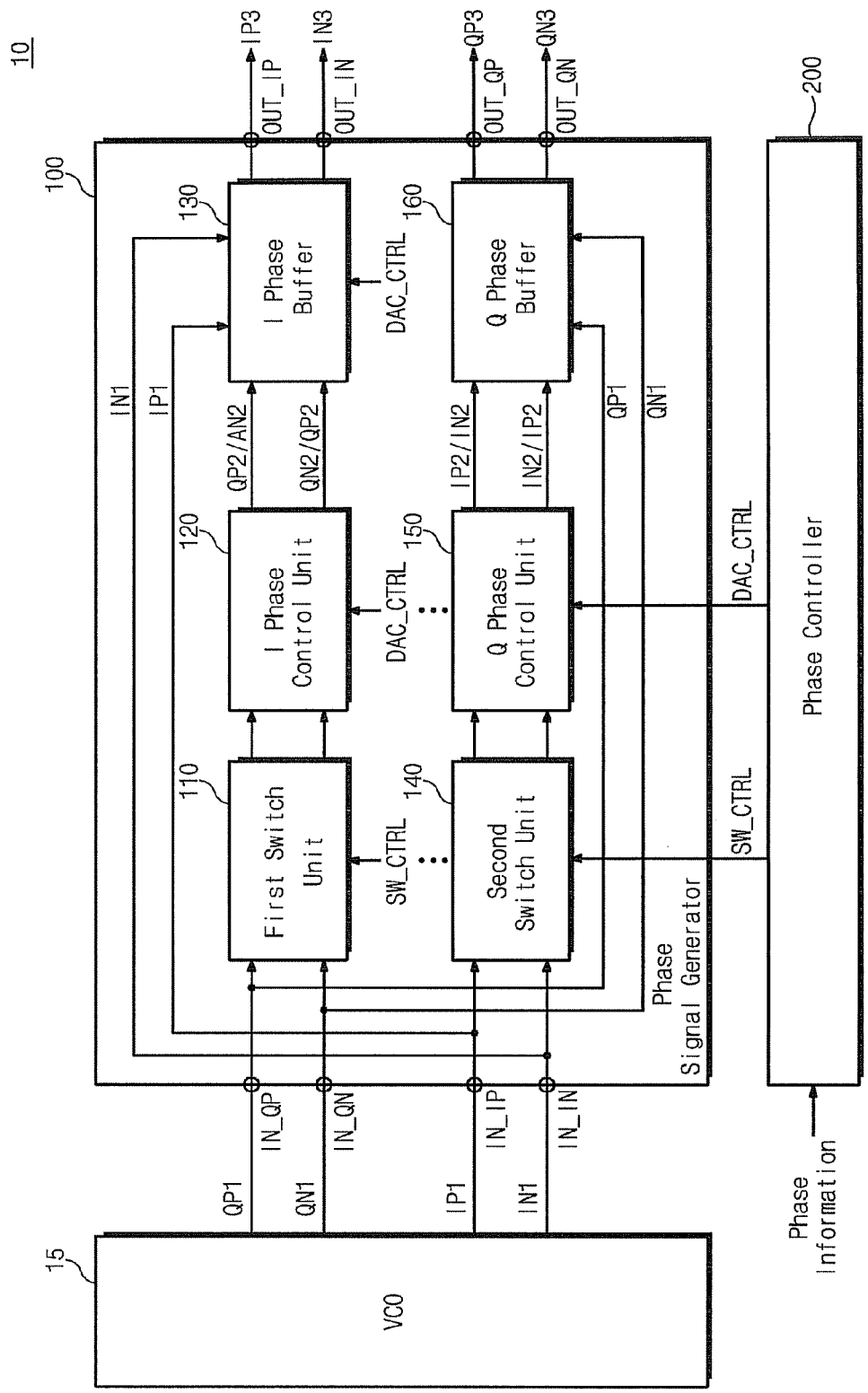
FIG. 1 is a diagram illustrating the structure of a phase signal generating apparatus according to an example embodiment of inventive concepts.

Example embodiments of inventive concepts will be described below in more detail with reference to the accompanying drawings. Inventive concepts may, however, be embodied in different forms and should not be construed as limited to example embodiments set forth herein. Rather, example embodiments are provided so that this disclosure will be thorough and complete, and will fully convey the scope of inventive concepts to those skilled in the art.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Inventive concepts relate to a communication system, and particularly, provide a phase signal generating apparatus which controls a phase between phase signals.

In example embodiments of inventive concepts, a phase signal that will be described below includes an in-phase (I) signal and a quadrature phase (Q) signal. The in-phase signal includes a positive in-phase signal (IP) having a positive polarity and a negative in-phase signal (IN) having a negative polarity. Moreover, the quadrature phase signal includes a positive quadrature phase signal (QP) having a positive polarity and a negative quadrature phase signal (QN) having a negative polarity.

An in-phase signal and a quadrature phase signal have a 90-degree phase difference 'θ'.

FIG. 1 is a diagram illustrating the structure of a phase signal generating apparatus according to an example embodiment of inventive concepts.

Referring to FIG. 1, a phase signal generating apparatus 10 according to an example embodiment of inventive concepts includes a phase signal generator 100 and a phase controller 200.

The phase controller 200 receives phase information. The phase controller 200 generates a switch control signal SW_CTRL and a phase control signal DAC_CTRL according to the phase information. As an example, the phase information includes phase difference information between phase signals or phase angle information between the phase signals. The phase difference information is one that represents phase difference between an in-phase signal and a quadrature phase signal. The phase angle information is one that represents the rotation phase angle of an in-phase signal and a quadrature phase signal from the in-phase axis (I axis) or quadrature phase axis (Q axis) of a vector graph.

The phase controller 200 provides the switch control signal SW_CTRL and the phase control signal DAC_CTRL for generating a phase signal.

The phase signal generator 100 includes a first switch unit 110, an in-phase (I phase) control unit 120, an in-phase buffer 130, a second switch unit 140, a quadrature phase (Q phase) control unit 150, and a quadrature phase buffer 160.

The phase signal generator 100 includes an in-phase signal generation unit for generating an in-phase signal, and a quadrature phase signal generation unit for generating a quadrature phase signal. The in-phase signal generating unit includes the first switch unit 110, the in-phase control unit 120 and the in-phase buffer 130. The quadrature phase signal generation unit includes the second switch unit 140, the quadrature phase control unit 150, and the quadrature phase buffer 160.

The phase signal generator 100 includes in-phase signal input ports IN_IP and IN_IN for receiving in-phase signals IP1 and IN1, respectively, and quadrature phase signal input ports IN_QP and IN_QN for receiving quadrature phase signals QP1 and QN1, respectively. The phase signal generator 100 includes in-phase signal output ports OUT_IP and OUT_IN for OUT_QP outputting in-phase signals IP3 and IN3, respectively, and quadrature phase signal output ports OUT_QP and OUT_QN for outputting quadrature phase signals QP3 and QN3, respectively. The in-phase signals IP3 and IN3 and the quadrature phase signals QP3 and QN3 may also be referred to as adjusted phase signals.

The phase signal generator 100 receives the in-phase signals IP1 and IN1 and the quadrature phase signals QP1 and QN1. As an example, the in-phase signals IP1 and IN1 and the quadrature phase signals QP1 and QN1 are generated from a Voltage Controlled Oscillator (VCO) 15.

The first switch unit 110 receives a first positive quadrature phase signal QP1 and a first negative quadrature phase signal QN1. The first switch unit 110 switches the first positive quadrature phase signal QP1 and the first negative quadrature phase signal QN1 to the in-phase control unit 120 in response to the switch control signal SW_CTRL. The first positive quadrature phase signal QP1 and the first negative quadrature phase signal QN1 are switched to be combined (mixed) with a first positive in-phase signal IP1 and a first negative in-phase signal IN1, respectively, or vice versa in one of a series-linking scheme and a cross-linking scheme.

The first switch unit 110 performs switching in consideration of the polarities (positive (+) polarity or negative (−) polarity) of the first positive quadrature phase signal QP1 and the first negative quadrature phase signal QN1.

The in-phase control unit 120 generates a second positive quadrature phase signal QP2 from the switched first positive quadrature phase signal QP1 in response to the phase control signal DCA_CTRL. The in-phase control unit 120 generates a second negative quadrature phase signal QN2 from the switched first negative quadrature phase signal QN1 in response to the phase control signal DCA_CTRL.

The in-phase control unit 120 outputs the second positive quadrature phase signal QP2 and the second negative quadrature phase signal QN2 to the in-phase buffer 130. The in-phase control unit 120 controls the phase of the first positive in-phase signal IP1 and the phase of the first negative in-phase signal IN1 that are inputted to the in-phase buffer 130 on the basis of the second positive quadrature phase signal QP2 and the second negative quadrature phase signal QN2.

Figure 2:
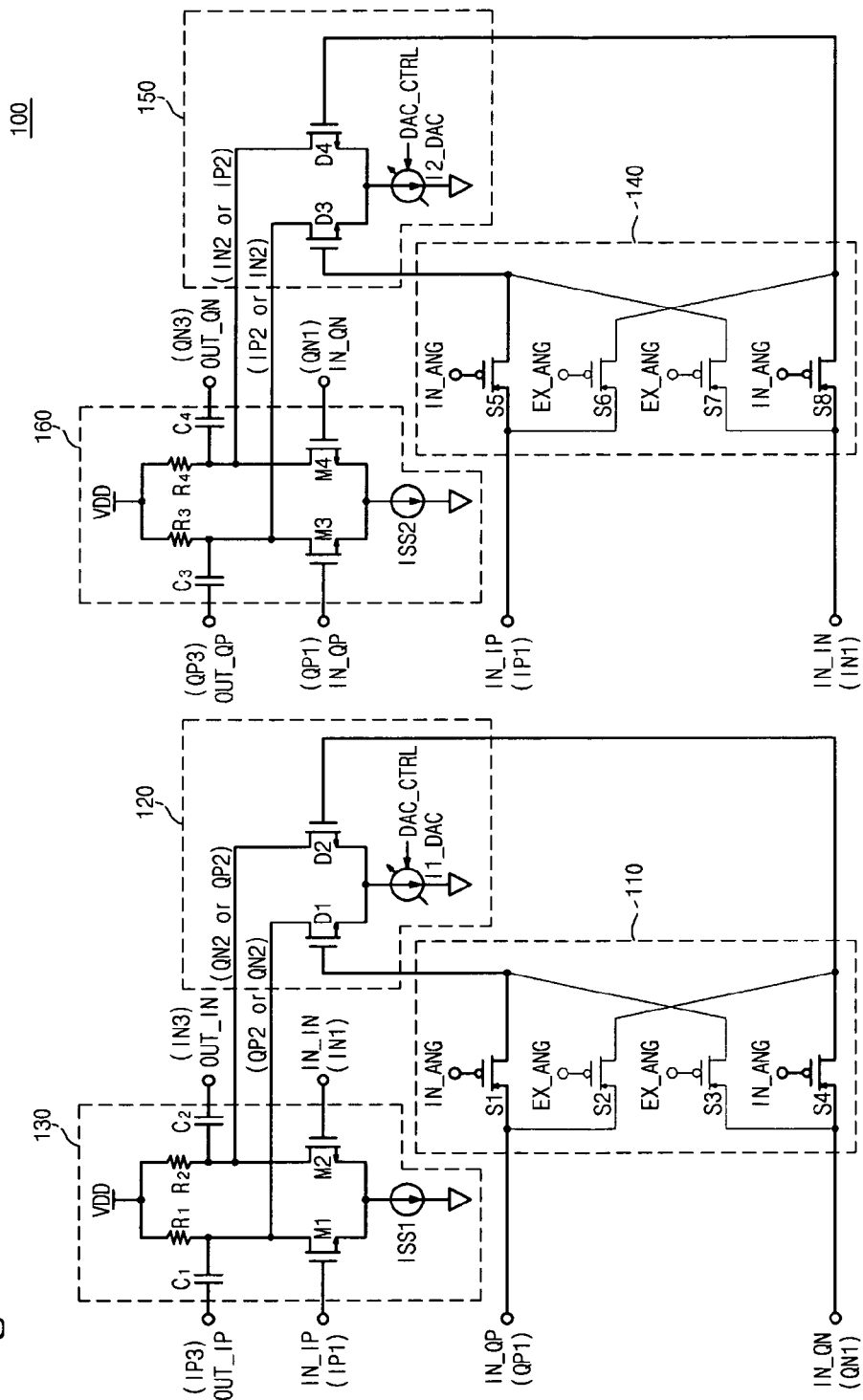
FIG. 2 illustrates an example embodiment of a phase signal generator illustrated in FIG. 1.

Shown in FIG. 2, the in-phase buffer 130 includes first and second main paths (path systems) which are formed in parallel between a power source voltage VDD terminal and a first constant current source ISS1 (which is connected to a ground terminal). The first main path includes a positive in-phase signal input port IN_IP and a positive in-phase signal output port OUT_IP. The second main path includes a negative in-phase signal input port IN_IN and a negative in-phase signal output port OUT_IN.

The in-phase buffer 130 receives the first positive in-phase signal IP1 through the positive in-phase signal input port IN_IP. The in-phase buffer 130 receives the first negative in-phase signal IN1 through the negative in-phase signal input port IN_IN.

The in-phase buffer 130 mixes the first positive in-phase signal IP1, which is inputted to the first main path, with one of the second positive quadrature phase signal QP2 and the second negative quadrature phase signal QN2 to control the phase of the first positive in-phase signal IP1. The in-phase buffer 130 mixes the first negative in-phase signal IN1, which is inputted to the second main path, with one of the second positive quadrature phase signal QP2 and the second negative quadrature phase signal QN2 to control the phase of the first negative in-phase signal IN1.

The in-phase buffer 130 outputs a phase-controlled first positive in-phase signal (hereinafter referred to as a third positive in-phase signal IP3) through the positive in-phase signal output port OUT_IP. The in-phase buffer 130 outputs a phase-controlled first negative in-phase signal (hereinafter referred to as a third negative in-phase signal IN3) through the negative in-phase signal output port OUT_IN.

The second switch unit 140 receives the first positive in-phase signal IP1 and the first negative in-phase signal IN1. The second switch unit 140 switches the first positive in-phase signal IP1 and the first negative in-phase signal IN1 to the quadrature phase control unit 150 in response to the switch control signal SW_CTRL. The first positive in-phase signal IP1 and the first negative in-phase signal IN1 are switched to be combined with the first positive quadrature phase signal QP1 and the first negative quadrature phase signal QN1, respectively, or vice versa in one of a series-linking scheme and a cross-linking scheme.

The second switch unit 140 performs switching in consideration of the polarity of the first positive in-phase signal IP1 and the polarity of the first negative in-phase signal IN1.

The quadrature phase control unit 150 generates a second positive in-phase signal IP2 from the switched first positive in-phase signal IP1 in response to the phase control signal DCA_CTRL. The quadrature phase control unit 150 generates a second negative in-phase signal IN2 from the switched first negative in-phase signal IN1 in response to the phase control signal DCA_CTRL.

The quadrature phase control unit 150 outputs the second positive in-phase signal IP2 and the second negative in-phase signal IN2 to the quadrature phase buffer 160. The quadrature phase control unit 150 controls the phase of the first positive quadrature signal QP1 and the phase of the first negative quadrature signal QN1 that are inputted to the in-phase buffer 130 on the basis of the second positive in-phase signal IP2 and the second negative in-phase signal IN2.

The quadrature phase buffer 160 includes third and fourth main paths which are formed in parallel between the power source voltage VDD terminal and a second constant current source ISS2. The third main path includes a positive quadrature signal input port IN_QP and a positive quadrature signal output port OUT_QP. The fourth main path includes a negative quadrature signal input port IN_QN and a negative quadrature signal output port OUT_QN.

The quadrature phase buffer 160 receives the first positive in-phase signal IP1 through the positive quadrature signal input port IN_QP. The quadrature phase buffer 160 receives the first negative in-phase signal IN1 through the negative quadrature signal input port IN_QN.

The quadrature phase buffer 160 mixes the first positive quadrature phase signal QP1, which is inputted to the third main path, with one of the second positive in-phase signal IP2 and the second negative in-phase signal IN2 to control the phase of the first positive quadrature phase signal QP1. The quadrature phase buffer 160 mixes the first negative quadrature phase signal QN1, which is inputted to the fourth main path, with one of the second negative in-phase signal IN2 and the second positive in-phase signal IP2 to control the phase of the first negative quadrature phase signal QN1.

The quadrature phase buffer 160 outputs a phase-controlled first positive quadrature phase signal (hereinafter referred to as a third positive quadrature phase signal QP3) through the positive quadrature phase signal output port OUT_QP. The quadrature phase buffer 160 outputs a phase-controlled first negative quadrature phase signal (hereinafter referred to as a third negative quadrature phase signal QN3) through the negative quadrature phase signal output port OUT_QN.

FIG. 2 is a diagram illustrating an example embodiment of the phase signal generator 100 shown in FIG. 1.

Referring to FIG. 2, the phase signal generator 100 includes the first switch unit 110, the in-phase control unit 120, the in-phase buffer 130, the second switch unit 140, the quadrature phase control unit 150, and the quadrature phase buffer 160.

The first switch unit 110 includes four switches S1 to S4. As an example, each of the switches S1 to S4 may be configured with a PMOS transistor. The first switch unit 110 receives the first positive quadrature phase signal QP1 and the first negative quadrature phase signal QN1.

A first PMOS transistor S1 is connected to a first positive quadrature phase signal input port IN_QP and the gate of a first NMOS transistor D1. A second PMOS transistor S2 is connected to the first positive quadrature phase signal input port IN_QP and the gate of a second NMOS transistor D2. A third PMOS transistor S3 is connected to a first negative quadrature phase signal input port IN_QN and the gate of the first NMOS transistor D1. A fourth PMOS transistor S4 is connected to the first negative quadrature phase signal input port IN_QN and the gate of the second NMOS transistor D2. The switch control signal SW_CTRL is applied to the gates of the first to fourth PMOS transistors S1 to S4. The first to fourth PMOS transistors S1 to S4 are turned on/off in response to the switch control signal SW_CTRL.

The in-phase buffer 130 includes a fifth NMOS transistor M1, a sixth NMOS transistor M2, a first constant current source ISS1, resistors R1 and R2, and capacitors C1 and C2.

The in-phase buffer 130 is driven with a power source voltage VDD that is supplied. The first constant current source ISS1 is connected to the ground terminal GND. The power source voltage VDD terminal is connected to the contact point of the first and second resistors R1 and R2. As an example, the first and second resistors R1 and R2 have the same resistance value.

The fifth NMOS transistor M1 is connected to the first resistor R1 and the first constant current source ISS1. The first positive in-phase signal IP1 is applied to the gate of the fifth NMOS transistor M1. The positive in-phase signal output port OUT_IP, through which a third positive in-phase, signal IP3 is outputted via the first capacitor C1, is connected to a contact point between the first resistor R1 and the fifth NMOS transistor M1.

The sixth NMOS transistor M2 is connected to the second resistor R2 and the first constant current source ISS1. The first negative in-phase signal IN1 is applied to the gate of the sixth NMOS transistor M2. The negative in-phase signal output port OUT_IN, through which the third negative in-phase signal IN3 is outputted via the second capacitor C2, is connected to a contact point between the second resistor R2 and the sixth NMOS transistor M2.

As an example, the first and second capacitors C1 and C2 have the same capacity.

The in-phase control unit 120 includes a first NMOS transistor D1, a second NMOS transistor D2, and a first variable current source I1_DAC.

The first variable current source I1_DAC is connected to the ground terminal. The first variable current source I1_DAC sets a current value in response to the phase control signal DAC_CTRL. That is, the phase control signal DAC_CTRL is a signal for controlling the current value of the first variable current source I1_DAC.

A contact point between the first and second NMOS transistors D1 and D2 is connected to the first variable current source I1_DAC. Moreover, the first NMOS transistor D1 is connected to a contact point between a positive in-phase signal input port (the fifth NMOS transistor M1) and a positive in-phase signal output port (the first capacitor C1). The second NMOS transistor D2 is connected to a contact point between a negative in-phase signal input port (the sixth NMOS transistor M2) and a negative in-phase signal output port (the second capacitor C2).

The second switch unit 140 includes four switches S5 to S8. As an example, each of the switches S5 to S8 may be configured with a PMOS transistor. The second switch unit 140 receives the first positive in-phase signal IP1 and the first negative in-phase signal IN1.

A fifth PMOS transistor S5 is connected to a first positive in-phase signal input port IN_IP and the gate of a third NMOS transistor D3. A sixth PMOS transistor S6 is connected to the first positive in-phase signal input port IN_IP and the gate of a fourth NMOS transistor D4. A seventh PMOS transistor S7 is connected to a first negative in-phase signal input port IN_IN and the gate of the third NMOS transistor D3. An eighth PMOS transistor S8 is connected to the first negative in-phase signal input port IN_IN and the gate of the fourth NMOS transistor D4. The switch control signal SW_CTRL is applied to the gates of the fifth to eighth PMOS transistors S5 to S8. The fifth to eighth PMOS transistors S5 to S8 are turned on/off in response to the switch control signal SW_CTRL.

The quadrature buffer 160 includes a seventh NMOS transistor M3, an eighth NMOS transistor M4, a second constant current source ISS2, resistors R3 and R4, and capacitors C3 and C4.

The quadrature buffer 160 is driven with the power source voltage VDD that is supplied. The second constant current source ISS2 is connected to the ground terminal GND. The power source voltage VDD terminal is connected to the contact point of the third and fourth resistors R3 and R4. As an example, the third and fourth resistors R3 and R4 have the same resistance value.

The seventh NMOS transistor M3 is connected to the third resistor R3 and the second constant current source ISS2. The first positive quadrature phase signal QP1 is applied to the gate of the seventh NMOS transistor M3. The positive quadrature phase signal output port OUT_QP, through which the third positive quadrature phase signal QP3 is outputted via the third capacitor C3, is connected to a contact point between the third resistor R3 and the seventh NMOS transistor M3.

The eighth NMOS transistor M4 is connected to the fourth resistor R4 and the second constant current source ISS2. The first negative quadrature phase signal QN1 is applied to the gate of the eighth NMOS transistor M4. The negative quadrature phase signal output port OUT_QN, through which the third negative quadrature phase signal QN3 is outputted via the fourth capacitor C4, is connected to a contact point between the fourth resistor R4 and the eighth NMOS transistor M4.

As an example, the third and fourth capacitors C3 and C4 have the same capacity.

The quadrature phase control unit 150 includes a third NMOS transistor D3, a fourth NMOS transistor D4, and a second variable current source I2_DAC.

The second variable current source I2_DAC is connected to the ground terminal. The second variable current source I2_DAC sets a current value in response to the phase control signal DAC_CTRL. That is, the phase control signal DAC_CTRL is a signal for controlling the current value of the second variable current source I2_DAC.

A contact point between the third and fourth NMOS transistors D3 and D4 is connected to the second variable current source I2_DAC. Moreover, the third NMOS transistor D3 is connected to a contact point between a positive quadrature phase signal input port (the seventh NMOS transistor M3) and a positive quadrature phase signal output port (the third capacitor C3). The fourth NMOS transistor D4 is connected to a contact point between a negative quadrature phase signal input port (the eighth NMOS transistor M4) and a negative quadrature phase signal output port (the fourth capacitor C4).

The first and second variable current sources I1_DAC and I2_DAC may have the same current value or different current values in response to the phase control signal DAC_CTRL.

In FIG. 2, the first and second switch units 110 and 140 operate in response to the switch control signal SW_CTRL. The first PMOS transistor S1, the fourth PMOS transistor S4, the fifth PMOS transistor S5 and the eighth PMOS transistor S8 form one group, i.e., a first group. The second PMOS transistor S2, the third PMOS transistor S3, the sixth PMOS transistor S6 and the seventh PMOS transistor S7 form another group, i.e., a second group. The PMOS transistors included in one group are simultaneously turned on/off.

The first to eighth PMOS transistors S1 to S8 are turned on/off in response to the switch control signal SW_CTRL. Moreover, the switch control signal SW_CTRL may be divided into a first group PMOS transistor control signal IN_ANG for controlling the PMOS transistors S1, S4, S5 and S8 of the first group and a second group PMOS transistor control signal EX_ANG for controlling the PMOS transistors S2, S3, S6 and S7 of the second group.

First, a case in which the PMOS transistors S1, S4, S5 and S8 of the first group are turned on will be described below. At this point, the switch control signal SW_CTRL is one for turning on the PMOS transistors S1, S4, S5 and S8 of the first group.

The PMOS transistors S1, S4, S5 and S8 of the first group are turned on in response to the switch control signal SW_CTRL (for example, the first group PMOS transistor control signal IN_ANG has a high level). At this point, the PMOS transistors S2, S3, S6 and S7 of the second group are turned off in response to the switch control signal SW_CTRL (for example, the second group PMOS transistor control signal EX_ANG has a low level).

The operation of the first switch unit 110 is as follows. The first switch unit 110 operates in response to the switch control signal SW_CTRL. The first PMOS transistor S1 switches the first positive quadrature phase signal QP1 to the gate of the first NMOS transistor D1. The fourth PMOS transistor S4 switches the first negative quadrature phase signal QN1 to the gate of the second NMOS transistor D2.

The operation of the in-phase control unit 120 is as follows. The in-phase control unit 120 operates in response to the phase control signal DAC_CTRL. The first NMOS transistor D1 generates the second positive quadrature phase signal QP2 in response to the first positive quadrature phase signal QP1. The second NMOS transistor D2 generates the second negative quadrature phase signal QN2 in response to the first negative quadrature phase signal QN1. The current value of the first variable current source I1_DAC is varied in response to the phase control signal DAC_CTRL.

The magnitude (for example, amplitude) of the second positive quadrature phase signal QP2 and the magnitude of the second negative quadrature phase signal QN2 are proportional to the current strength of the first variable current source I1_DAC. The first variable current source I1_DAC controls the magnitude of the second positive quadrature phase signal QP2 and the magnitude of the second negative quadrature phase signal QN2 in response to the phase control signal DAC_CTRL.

The operation of the in-phase buffer 130 is as follows. The fifth NMOS transistor M1 amplifies the first positive in-phase signal IP1 according to the current value of the first constant current source ISS1. The sixth NMOS transistor M2 amplifies the first negative in-phase signal IN1 according to the current value of the first constant current source ISS1. The magnitude of the first positive in-phase signal IP1 and the magnitude of the first negative in-phase signal IN1 are proportional to the current value of the first constant current source ISS1.

The in-phase buffer 130 mixes the first positive in-phase signal IP1 and the second positive quadrature phase signal QP2 for generating the third positive in-phase signal IP3. The in-phase buffer 130 mixes the first negative in-phase signal IN1 and the second negative quadrature phase signal QN2 for generating the third negative in-phase signal IN3. Herein, the first positive in-phase signal IP1 and the first negative in-phase signal IN1 are signals in which a magnitude is controlled by a constant current source.

The operation of the second switch unit 140 is as follows. The second switch unit 140 operates in response to the switch control signal SW_CTRL. The fifth PMOS transistor S5 switches the first positive in-phase signal IP1 to the gate of the third NMOS transistor D3. The eighth PMOS transistor S8 switches the first negative in-phase signal IN1 to the gate of the fourth NMOS transistor D4.

The operation of the quadrature phase control unit 150 is as follows. The quadrature phase control unit 150 operates in response to the phase control signal DAC_CTRL. The third NMOS transistor D3 generates the second positive in-phase signal IP2 in response to the first positive in-phase signal IP1. The fourth NMOS transistor D4 generates the second negative in-phase signal IN2 in response to the first negative in-phase signal IN1. The current value of the second variable current source I2_DAC is varied in response to the phase control signal DAC_CTRL.

The magnitude (for example, amplitude) of the second positive in-phase signal IP2 and the magnitude of the second negative in-phase signal IN2 are amplified in proportion to the current strength of the second variable current source I2_DAC. The second variable current source I2_DAC controls the magnitude of the second positive in-phase signal IP2 and the magnitude of the second negative in-phase signal IN2.

The operation of the quadrature phase buffer 160 is as follows. The sixth NMOS transistor M3 amplifies the first positive quadrature phase signal QP1 according to the current value of the second constant current source ISS2. The seventh NMOS transistor M4 amplifies the first negative quadrature phase signal QN1 according to the current value of the second constant current source ISS2. The magnitude of the first positive in-phase signal IP1 and the magnitude of the first negative in-phase signal IN1 are proportional to the current value of the second constant current source ISS2.

The in-phase buffer 130 mixes the first positive in-phase signal IP1 and the second positive quadrature phase signal QP2 for generating the third positive in-phase signal IP3. The in-phase buffer 130 mixes the first negative in-phase signal IN1 and the second negative quadrature phase signal QN2 for generating the third negative in-phase signal IN3. Herein, the first positive in-phase signal IP1 and the first negative in-phase signal IN1 are signals in which a magnitude is controlled by the second constant current source ISS2.

When the PMOS transistors S1, S4, S5 and S8 of the first group are turned on, the phase difference "∠Q−∠I" between the in-phase signal I (IP3 and IN3) and the quadrature phase signal Q (QP3 and QN3) that are generated in the phase signal generator 100 is less than 90 degrees. Herein, as the magnitude of the second positive quadrature phase signal QP2, the magnitude of the second positive in-phase signal IP2, the magnitude of the second negative quadrature phase signal QN2 or the magnitude of the second negative in-phase signal IN2 increases, the phase difference between the in-phase signal I (IP3 and IN3) and the quadrature phase signal Q (QP3 and QN3) gradually decreases with respect to 90 degrees.

Second, a case in which the PMOS transistors S2, S3, S6 and S7 of the second group are turned on will be described below. At this point, the switch control signal SW_CTRL is one for turning on the PMOS transistors S2, S3, S6 and S7 of the second group.

The PMOS transistors S2, S3, S6 and S7 of the second group are turned on in response to the switch control signal SW_CTRL (for example, the first group PMOS transistor control signal IN_ANG has a high level). At this point, the PMOS transistors S1, S4, S5 and S8 of the first group are turned off in response to the switch control signal SW_CTRL (for example, the second group PMOS transistor control signal EX_ANG has a low level).

The operation of the first switch unit 110 is as follows. The first switch unit 110 operates in response to the switch control signal SW_CTRL. The second PMOS transistor S2 switches the first positive quadrature phase signal QP1 to the gate of the second NMOS transistor D2. The third PMOS transistor S3 switches the first negative quadrature phase signal QN1 to the gate of the first NMOS transistor D1.

The operation of the in-phase control unit 120 is as follows. The in-phase control unit 120 operates in response to the phase control signal DAC_CTRL. The first NMOS transistor D1 generates the second negative quadrature phase signal QN2 in response to the first negative quadrature phase signal QN1. The second NMOS transistor D2 generates the second positive quadrature phase signal QP2 in response to the first positive quadrature phase signal QP1. The current value of the first variable current source I1_DAC is varied in response to the phase control signal DAC_CTRL.

The magnitude of the second positive quadrature phase signal QP2 and the magnitude of the second negative quadrature phase signal QN2 are proportional to the current strength of the first variable current source I1_DAC. The first variable current source I1_DAC controls the magnitude of the second positive quadrature phase signal QP2 and the magnitude of the second negative quadrature phase signal QN2 in response to the phase control signal DAC_CTRL.

The operation of the in-phase buffer 130 is as follows. The fifth NMOS transistor M1 amplifies the first positive in-phase signal IP1 according to the current value of the first constant current source ISS1. The sixth NMOS transistor M2 amplifies the first negative in-phase signal IN1 according to the current value of the first constant current source ISS1. The magnitude of the first positive in-phase signal IP1 and the magnitude of the first negative in-phase signal IN1 are proportional to the current value of the first constant current source ISS1.

The in-phase buffer 130 mixes the first positive in-phase signal IP1 and the second negative quadrature phase signal QN2 for generating the third positive in-phase signal IP3. The in-phase buffer 130 mixes the first negative in-phase signal IN1 and the second positive quadrature phase signal QP2 for generating the third negative in-phase signal IN3. Herein, the first positive in-phase signal IP1 and the first negative in-phase signal IN1 are signals in which a magnitude is controlled by the first constant current source ISS1.

The operation of the second switch unit 140 is as follows. The second switch unit 140 operates in response to the switch control signal SW_CTRL. The sixth PMOS transistor S6 switches the first positive in-phase signal IP1 to the gate of the fourth NMOS transistor D4. The seventh PMOS transistor S7 switches the first negative in-phase signal IN1 to the gate of the third NMOS transistor D3.

The operation of the quadrature phase control unit 150 is as follows. The quadrature phase control unit 150 operates in response to the phase control signal DAC_CTRL. The third NMOS transistor D3 generates the second negative in-phase signal IN2 in response to the first negative in-phase signal IN1. The fourth NMOS transistor D4 generates the second positive in-phase signal IP2 in response to the first positive in-phase signal IP1. The current value of the second variable current source I2_DAC is varied in response to the phase control signal DAC_CTRL.

The magnitude of the second negative in-phase signal IN2 and the magnitude of the second positive in-phase signal IP2 are amplified in proportion to the current strength of the second variable current source I2_DAC. The second variable current source I2_DAC controls the magnitude of the second positive in-phase signal IP2 and the magnitude of the second negative in-phase signal IN2.

The operation of the quadrature phase buffer 160 is as follows. The sixth NMOS transistor M3 amplifies the first positive quadrature phase signal QP1 according to the current value of the second constant current source ISS2. The seventh NMOS transistor M4 amplifies the first negative quadrature phase signal QN1 according to the current value of the second constant current source ISS2. The magnitude of the first positive in-phase signal IP1 and the magnitude of the first negative in-phase signal IN1 are proportional to the current value of the second constant current source ISS2.

The in-phase buffer 130 mixes the first positive in-phase signal IP1 and the second negative quadrature phase signal QN2 for generating the third positive in-phase signal IP3. The in-phase buffer 130 mixes the first negative in-phase signal IN1 and the second positive quadrature phase signal QP2 for generating the third negative in-phase signal IN3. Herein, the first positive in-phase signal IP1 and the first negative in-phase signal IN1 are signals in which a magnitude is controlled by the second constant current source ISS2.

When the PMOS transistors S2, S3, S6 and S7 of the second group are turned on, the phase difference "∠Q−∠I" between the in-phase signal I (IP3 and IN3) and the quadrature phase signal Q (QP3 and QN3) that are generated in the phase signal generator 100 is equal to or greater than 90 degrees. Herein, as the magnitude of the second positive quadrature phase signal QP2, the magnitude of the second positive in-phase signal IP2, the magnitude of the second negative quadrature phase signal QN2 or the magnitude of the second negative in-phase signal IN2 increases, the phase difference between the in-phase signal I (IP3 and IN3) and the quadrature phase signal Q (QP3 and QN3) gradually increases with respect to 90 degrees.

Figure 3:
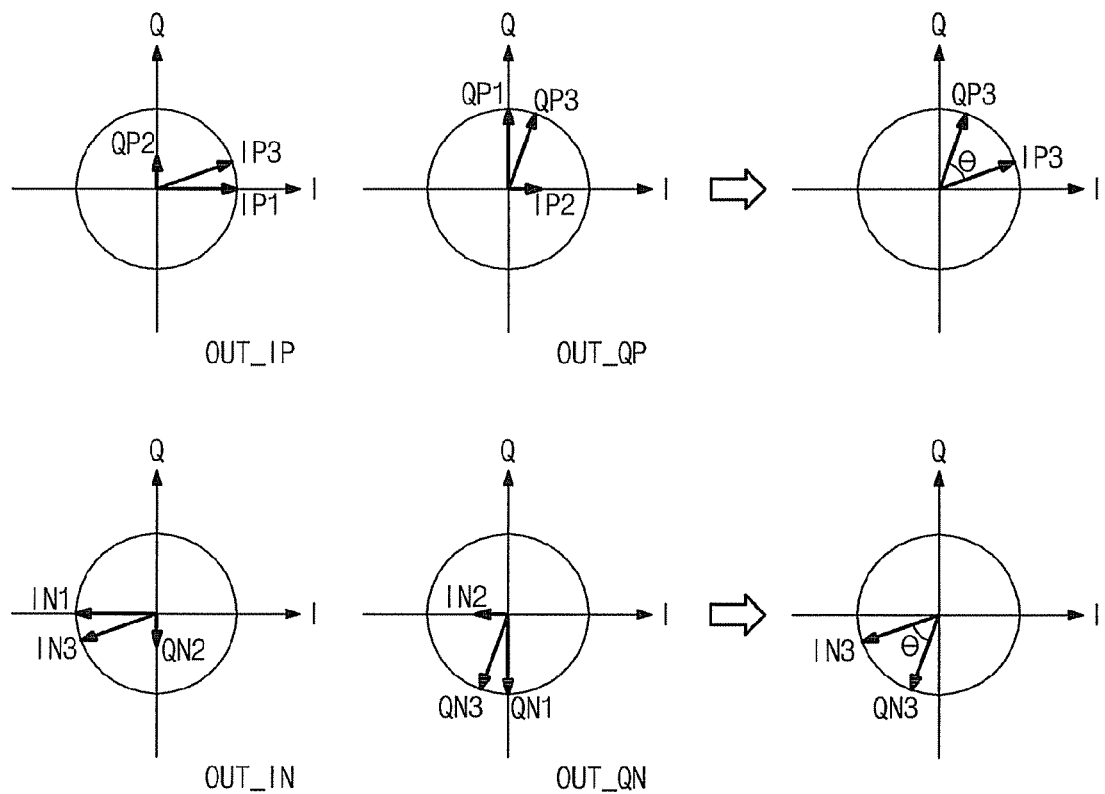
FIG. 3 is a diagram illustrating vector graphs of phase signals in the phase signal generator of FIG. 2 according an example embodiment.

FIG. 3 is a diagram illustrating the vector graphs of phase signals when the PMOS transistors of the first group are turned-on in the phase signal generator which is exemplarily illustrated in FIG. 2.

Referring to FIG. 3, the output signals (the third positive in-phase signal IP3 and the third negative in-phase signal IN3 that are respectively outputted through the output ports (the positive in-phase signal output port OUT_IP and the negative in-phase signal output port OUT_IN) of the in-phase buffer 130 of the phase signal generator 100 and the output signals (the third positive quadrature phase signal QP3 and the third negative quadrature phase signal QN3) that are respectively outputted through the output ports (the positive quadrature phase signal output port OUT_QP and the negative quadrature phase signal output port OUT_QN) of the quadrature phase buffer 160 of the phase signal generator 100 are illustrated in the type of a vector (which includes the phase component of each signal).

First, the in-phase buffer 130 outputs the third positive in-phase signal IP3 through the positive in-phase signal output port OUT_IP. The in-phase buffer 130 mixes the first positive in-phase signal IP1 and the second positive quadrature phase signal QP2 for generating the third positive in-phase signal IP3.

Second, the quadrature phase buffer 160 outputs the third positive quadrature phase signal QP3 through the positive quadrature phase signal output port OUT_QP. The quadrature phase buffer 160 mixes the first positive quadrature phase signal QP1 and the second positive in-phase signal IP2 for generating the third positive quadrature phase signal QP3.

When the PMOS transistors S1, S4, S5 and S8 of the first group are turned on, the phase difference between the third positive in-phase signal IP3 and the third positive quadrature phase signal QP3 is less than 90 degrees.

Third, the in-phase buffer 130 outputs the third negative in-phase signal IN3 through the negative in-phase signal output port OUT_IN. The in-phase buffer 130 mixes the first negative in-phase signal IN1 and the second negative quadrature phase signal QN2 for generating the third negative in-phase signal IN3.

Fourth, the quadrature phase buffer 160 outputs the third negative quadrature phase signal QN3 through the negative quadrature phase signal output port OUT_QN. The quadrature phase buffer 160 mixes the first negative quadrature phase signal QN1 and the second negative in-phase signal IN2 for generating the third negative quadrature phase signal QN3.

When the PMOS transistors S1, S4, S5 and S8 of the first group are turned on, the phase difference between the third negative in-phase signal IN3 and the third negative quadrature phase signal QN3 has a value less than 90 degrees.

Herein, phase difference may be varied with the magnitude of the second positive quadrature phase signal QP2, the magnitude of the second positive in-phase signal IP2, the magnitude of the second negative quadrature phase signal QN2 and the magnitude of the second negative in-phase signal IN2.

Herein, as the second positive quadrature phase signal QP2, the magnitude of the second positive in-phase signal IP2, the magnitude of the second negative quadrature phase signal QN2 or the magnitude of the second negative in-phase signal IN2 increases, the phase difference between the in-phase signal I (IP3 and IN3) and the quadrature phase signal Q (QP3 and QN3) gradually decreases with respect to 90 degrees.

Figure 4:
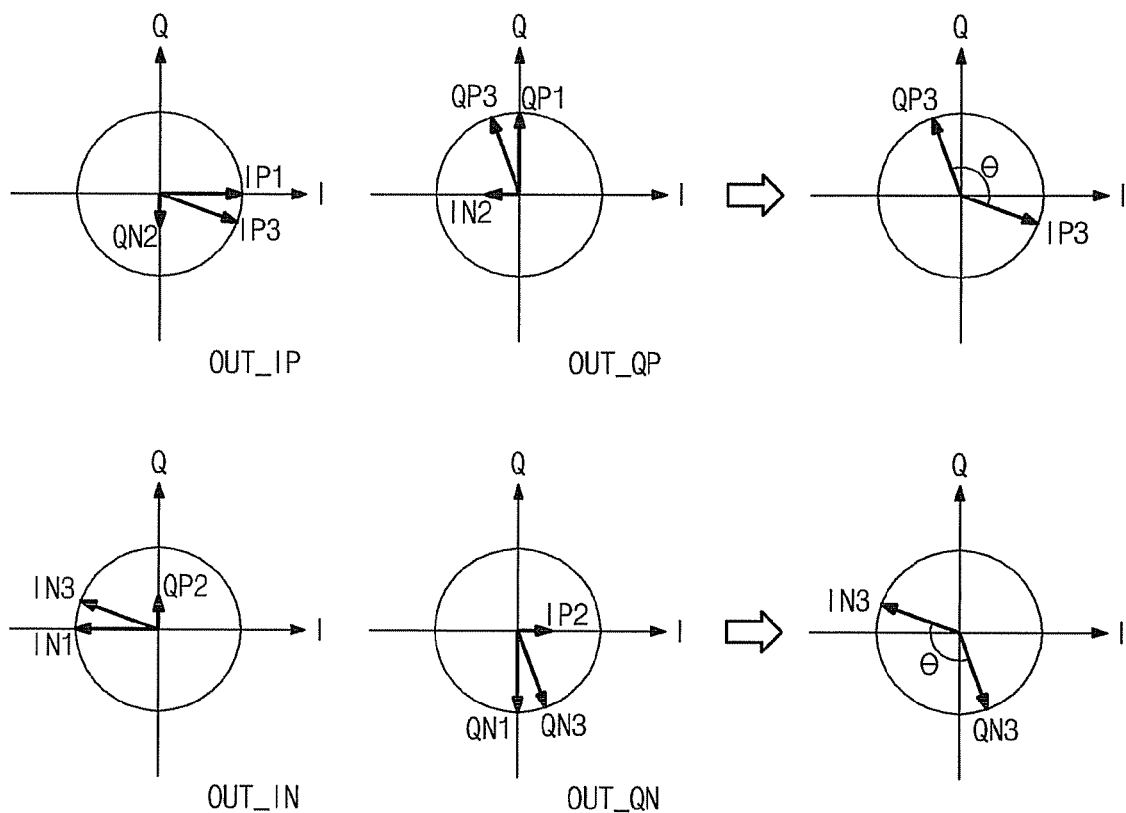
FIG. 4 is a diagram illustrating the vector graphs of phase signals in the phase signal generator of FIG. 2 according to an example embodiment.

FIG. 4 is a diagram illustrating the vector graphs of phase signals when the PMOS transistors of the second group in the phase signal generator which is exemplarily illustrated in FIG. 2 are turned-on.

Referring to FIG. 4, the output signals (the third positive in-phase signal IP3 and the third negative in-phase signal IN3 that are respectively outputted through the output ports (the positive in-phase signal output port OUT_IP and the negative in-phase signal output port OUT_IN) of the in-phase buffer 130 of the phase signal generator 100 and the output signals (the third positive quadrature phase signal QP3 and the third negative quadrature phase signal QN3) that are respectively outputted through the output ports (the positive quadrature phase signal output port OUT_QP and the negative quadrature phase signal output port OUT_QN) of the quadrature phase buffer 160 of the phase signal generator 100 are illustrated in a vector type.

First, the in-phase buffer 130 outputs the third positive in-phase signal IP3 through the positive in-phase signal output port OUT_IP. The in-phase buffer 130 mixes the first positive in-phase signal IP1 and the second negative quadrature phase signal QN2 for generating the third positive in-phase signal IP3.

Second, the quadrature phase buffer 160 outputs the third positive quadrature phase signal QP3 through the positive quadrature phase signal output port OUT_QP. The quadrature phase buffer 160 mixes the first positive quadrature phase signal QP1 and the second negative in-phase signal IN2 for generating the third positive quadrature phase signal QP3.

When the PMOS transistors S2, S3, S6 and S7 of the second group are turned on, the phase difference between the third positive in-phase signal IP3 and the third positive quadrature phase signal QP3 is equal to or greater than 90 degrees.

Third, the in-phase buffer 130 outputs the third negative in-phase signal IN3 through the negative in-phase signal output port OUT_IN. The in-phase buffer 130 mixes the first negative in-phase signal IN1 and the second positive quadrature phase signal QP2 for generating the third negative in-phase signal IN3.

Fourth, the quadrature phase buffer 160 outputs the third negative quadrature phase signal QN3 through the negative quadrature phase signal output port OUT_QN. The quadrature phase buffer 160 mixes the first negative quadrature phase signal QN1 and the second positive in-phase signal IP2 for generating the third negative quadrature phase signal QN3.

When the PMOS transistors S2, S3, S6 and S7 of the second group are turned on, the phase difference between the third negative in-phase signal IN3 and the third negative quadrature phase signal QN3 is equal to or greater than 90 degrees.

Herein, phase difference may be varied with the magnitude of the second positive quadrature phase signal QP2, the magnitude of the second positive in-phase signal IP2, the magnitude of the second negative quadrature phase signal QN2 and the magnitude of the second negative in-phase signal IN2. Herein, as the second positive quadrature phase signal QP2, the magnitude of the second positive in-phase signal IP2, the magnitude of the second negative quadrature phase signal QN2 or the magnitude of the second negative in-phase signal IN2 increases, a phase difference gradually increases with respect to 90 degrees.

As illustrated in FIGS. 2 through 4, the phase signal generator 100 generates a phase signal having a phase difference less than or greater than 90 degrees.

However, the phase signal generator 100 may set the current values of the first and second variable current sources I1_DAC and I2_DAC to 0 in response to the phase control signal DAC_CTRL. At this point, the phase signal generator 100 may generate phase signals (an in-phase signal and a quadrature phase signal) having a 90-degree phase difference. Moreover, the phase signal generator 100 may set the current values of the first and second variable current source I1_DAC and I2_DAC in order to have different current values, according to the phase control signal DAC_CTRL.

The phase signal generator 100 controls the phase difference between an in-phase signal and a quadrature phase signal. The phase signal generator 100 (see FIGS. 2 through 4) may generate phase signals having various phase differences. Therefore, when phase imbalance occurs in a communication system, the phase signal generating apparatus 10 can compensate the phase imbalance.

As illustrated in FIGS. 2 through 4, the phase signal generator 100 generates an in-phase signal and a quadrature phase signal that have various phase differences. When phase imbalance occurs in a device using phase signals, the phase signal generator 100 compensates phase imbalance.

The phase signal generator 100 for generating phase signals having various phase differences generates phase signals that prevent phase imbalance from occurring in the communication system.

Figure 5:
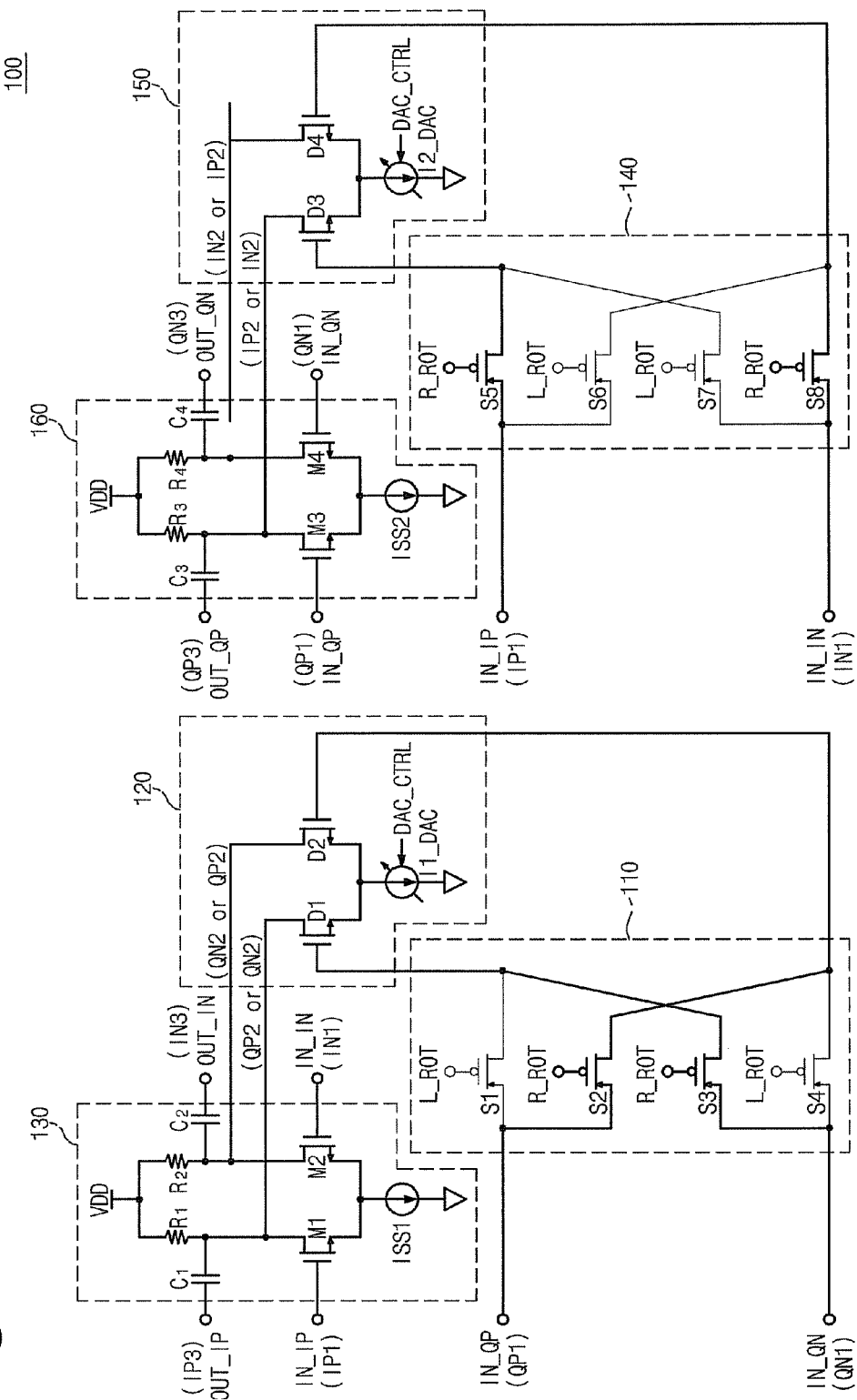
FIG. 5 is a diagram illustrating another example embodiment of the phase signal generator shown in FIG. 1.

FIG. 5 is a diagram illustrating another detailed structure of the phase signal generator which is exemplarily illustrated in FIG. 1.

Referring to FIG. 5, a phase signal generator 100 according to another example embodiment of inventive concepts has the same structure as that of the phase signal generator 100 according to an example embodiment of inventive concepts that has been described above with reference to FIG. 2. A description on the structure of the phase signal generator 100 according to an example embodiment of inventive concepts, which has been described above with reference to FIG. 2, will be applied to the phase signal generator 100 according to another example embodiment of inventive concepts.

Comparing differences between FIG. 2 and FIG. 5, groups including the switches, i.e., PMOS transistors S1 to S8 of the first and second switch units 110 and 140 are different.

In FIG. 5, the first and second switch units 110 and 140 operate in response to a switch control signal SW_CTRL. A first PMOS transistor S1, a fourth PMOS transistor S4, a sixth PMOS transistor S6 and a seventh PMOS transistor S7 form one group, i.e., a third group. A second PMOS transistor S2, a third PMOS transistor S3, a fifth PMOS transistor S5 and an eighth PMOS transistor S8 form another group, i.e., a fourth group. The PMOS transistors included in one group are simultaneously turned on/off.

The first to eighth PMOS transistors S1 to S8 are turned on/off in response to a switch control signal SW_CTRL. The switch control signal SW_CTRL may be divided into a third group PMOS transistor control signal L_ROT for controlling the PMOS transistors S1, S4, S6 and S7 of the third group and a fourth group PMOS transistor control signal R_ROT for controlling the PMOS transistors S2, S3, S5 and S8 of the fourth group.

First, a case in which the PMOS transistors S1, S4, S6 and S7 of the third group are turned on will be described below. At this point, the switch control signal SW_CTRL is one for turning on the PMOS transistors S1, S4, S6 and S7 of the third group.

When the PMOS transistors S1, S4, S6 and S7 of the third group are turned on in response to the switch control signal SW_CTRL (for example, the third group PMOS transistor control signal L_ROT has a high level), the PMOS transistors S2, S3, S5 and S8 of the fourth group are turned off in response to the switch control signal SW_CTRL (for example, the fourth group PMOS transistor control signal R_ROT has a low level).

The operation of the first switch unit 110 is as follows. The first switch unit 110 operates in response to the switch control signal SW_CTRL. The first PMOS transistor S1 switches a first positive quadrature phase signal QP1 to the gate of a first NMOS transistor D1. The fourth PMOS transistor S4 switches a first negative quadrature phase signal QN1 to the gate of the second NMOS transistor D2.

The operation of the in-phase control unit 120 is as follows. The in-phase control unit 120 operates in response to a phase control signal DAC_CTRL. The first NMOS transistor D1 generates a second positive quadrature phase signal QP2 in response to the first positive quadrature phase signal QP1. The second NMOS transistor D2 generates a second negative quadrature phase signal QN2 in response to the first negative quadrature phase signal QN1. The current value of a first variable current source I1_DAC is varied in response to the phase control signal DAC_CTRL.

The magnitude of the second positive quadrature phase signal QP2 and the magnitude of the second negative quadrature phase signal QN2 are proportional to the current strength of the first variable current source I1_DAC. The first variable current source I1_DAC controls the magnitude of the second positive quadrature phase signal QP2 and the magnitude of the second negative quadrature phase signal QN2 in response to the phase control signal DAC_CTRL.

The operation of the in-phase buffer 130 is as follows. The fifth NMOS transistor M1 amplifies a first positive in-phase signal IP1 according to the current value of a first constant current source ISS1. The sixth NMOS transistor M2 amplifies the first negative in-phase signal IN1 according to the current value of the first constant current source ISS1. The magnitude of the first positive in-phase signal IP1 and the magnitude of the first negative in-phase signal IN1 are proportional to the current value of the first constant current source ISS1.

The in-phase buffer 130 mixes the first positive in-phase signal IP1 and the second positive quadrature phase signal QP2 for generating a third positive in-phase signal IP3. The in-phase buffer 130 mixes the first negative in-phase signal IN1 and the second negative quadrature phase signal QN2 for generating a third negative in-phase signal IN3. Herein, the first positive in-phase signal IP1 and the first negative in-phase signal IN1 are signals in which a magnitude is controlled by a constant current source.

The operation of the second switch unit 140 is as follows. The second switch unit 140 operates in response to the switch control signal SW_CTRL. The sixth PMOS transistor S6 switches the first positive in-phase signal IP1 to the gate of the fourth NMOS transistor D4. The seventh PMOS transistor S7 switches the first negative in-phase signal IN1 to the gate of the third NMOS transistor D3.

The operation of the quadrature phase control unit 150 is as follows. The quadrature phase control unit 150 operates in response to the phase control signal DAC_CTRL. The third NMOS transistor D3 generates a second negative in-phase signal IN2 in response to the first negative in-phase signal IN1. The fourth NMOS transistor D4 generates the second positive in-phase signal IP2 in response to the first positive in-phase signal IP1. The current value of a second variable current source I2_DAC is varied in response to the phase control signal DAC_CTRL.

The magnitude of the second positive in-phase signal IP2 and the magnitude of the second negative in-phase signal IN2 are amplified in proportion to the current strength of the second variable current source I2_DAC. The second variable current source I2_DAC controls the magnitude of the second positive in-phase signal IP2 and the magnitude of the second negative in-phase signal IN2.

The operation of the quadrature phase buffer 160 is as follows. The sixth NMOS transistor M3 amplifies the first positive quadrature phase signal QP1 according to the current value of a second constant current source ISS2. The seventh NMOS transistor M4 amplifies the first negative quadrature phase signal QN1 according to the current value of the second constant current source ISS2. The magnitude of the first positive in-phase signal IP1 and the magnitude of the first negative in-phase signal IN1 are proportional to the current value of the second constant current source ISS2.

The in-phase buffer 130 mixes the first positive in-phase signal IP1 and the second negative quadrature phase signal QN2 for generating a third positive in-phase signal IP3. The in-phase buffer 130 mixes the first negative in-phase signal IN1 and the second positive quadrature phase signal QP2 for generating the third negative in-phase signal IN3. Herein, the first positive in-phase signal IP1 and the first negative in-phase signal IN1 are signals in which a magnitude is controlled by the second constant current source ISS2.

When the PMOS transistors S1, S4, S6 and S7 of the third group are turned on, the phase difference "∠Q−∠I" between the in-phase signal I (IP3 and IN3) and the quadrature phase signal Q (QP3 and QN3) that are generated in the phase signal generator 100 is 90 degrees. Herein, as the magnitude of the second positive quadrature phase signal QP2, the magnitude of the second positive in-phase signal IP2, the magnitude of the second negative quadrature phase signal QN2 or the magnitude of the second negative in-phase signal IN2 increases, a phase angle (for example, rotation phase angle) between the in-phase signal I (IP3 and IN3) and the quadrature phase signal Q (QP3 and QN3) gradually increases with respect to an I axis. That is, the in-phase signal I (IP3 and IN3) and the quadrature phase signal Q (QP3 and QN3) rotate counter-clockwise (i.e., left) about the I axis on a vector graph. The in-phase signal I (IP3 and IN3) and the quadrature phase signal Q (QP3 and QN3) maintain a 90-degree phase difference.

Second, a case in which the PMOS transistors S2, S3, S5 and S8 of the fourth group are turned on will be described below. At this point, the switch control signal SW_CTRL is one for turning on the PMOS transistors S2, S3, S5 and S8 of the fourth group.

The PMOS transistors S2, S3, S5 and S8 of the fourth group are turned on in response to the switch control signal SW_CTRL (for example, the fourth group PMOS transistor control signal R_ROT has a high level). At this point, the PMOS transistors S2, S3, S5 and S8 of the third group are turned off in response to the switch control signal SW_CTRL (for example, the third group PMOS transistor control signal L_ROT has a low level).

The operation of the first switch unit 110 is as follows. The first switch unit 110 operates in response to the switch control signal SW_CTRL. The second PMOS transistor S2 switches the first positive quadrature phase signal QP1 to the gate of the second NMOS transistor D2. The third PMOS transistor S3 switches the first negative quadrature phase signal QN1 to the gate of the first NMOS transistor D1.

The operation of the in-phase control unit 120 is as follows. The in-phase control unit 120 operates in response to the phase control signal DAC_CTRL. The first NMOS transistor D1 generates the second negative quadrature phase signal QN2 in response to the first negative quadrature phase signal QN1. The second NMOS transistor D2 generates the second positive quadrature phase signal QP2 in response to the first positive quadrature phase signal QP1. The current value of the first variable current source I1_DAC is varied in response to the phase control signal DAC_CTRL.

The magnitude of the second positive quadrature phase signal QP2 and the magnitude of the second negative quadrature phase signal QN2 are proportional to the current strength of the first variable current source I1_DAC. The first variable current source I1_DAC controls the magnitude of the second positive quadrature phase signal QP2 and the magnitude of the second negative quadrature phase signal QN2 in response to the phase control signal DAC_CTRL.

The operation of the in-phase buffer 130 is as follows. The fifth NMOS transistor M1 amplifies the first positive in-phase signal IP1 according to the current value of the first constant current source ISS1. The sixth NMOS transistor M2 amplifies the first negative in-phase signal IN1 according to the current value of the first constant current source ISS1. The magnitude of the first positive in-phase signal IP1 and the magnitude of the first negative in-phase signal IN1 are proportional to the current value of the first constant current source ISS1.

The in-phase buffer 130 mixes the first positive in-phase signal IP1 and the second negative quadrature phase signal QN2 for generating the third positive in-phase signal IP3. The in-phase buffer 130 mixes the first negative in-phase signal IN1 and the second positive quadrature phase signal QP2 for generating the third negative in-phase signal IN3. Herein, the first positive in-phase signal IP1 and the first negative in-phase signal IN1 are signals in which a magnitude is controlled by the first constant current source ISS1.

The operation of the second switch unit 140 is as follows. The second switch unit 140 operates in response to the switch control signal SW_CTRL. The fifth PMOS transistor S5 switches the first positive in-phase signal IP1 to the gate of the third NMOS transistor D3. The eighth PMOS transistor S8 switches the first negative in-phase signal IN1 to the gate of the fourth NMOS transistor D4.

The operation of the quadrature phase control unit 150 is as follows. The quadrature phase control unit 150 operates in response to the phase control signal DAC_CTRL. The third NMOS transistor D3 generates the second positive in-phase signal IP2 in response to the first positive in-phase signal IP1. The fourth NMOS transistor D4 generates the second negative in-phase signal IN2 in response to the first negative in-phase signal IN1. The current value of the second variable current source I2_DAC is varied in response to the phase control signal DAC_CTRL.

The magnitude of the second negative in-phase signal IN2 and the magnitude of the second positive in-phase signal IP2 are amplified in proportion to the current strength of the second variable current source I2_DAC. The second variable current source I2_DAC controls the magnitude of the second positive in-phase signal IP2 and the magnitude of the second negative in-phase signal IN2.

The operation of the quadrature phase buffer 160 is as follows. The sixth NMOS transistor M3 amplifies the first positive quadrature phase signal QP1 according to the current value of the second constant current source ISS2. The seventh NMOS transistor M4 amplifies the first negative quadrature phase signal QN1 according to the current value of the second constant current source ISS2. The magnitude of the first positive in-phase signal IP1 and the magnitude of the first negative in-phase signal IN1 are proportional to the current value of the second constant current source ISS2.

The in-phase buffer 130 mixes the first positive in-phase signal IP1 and the second positive quadrature phase signal QP2 for generating the third positive in-phase signal IP3. The in-phase buffer 130 mixes the first negative in-phase signal IN1 and the second negative quadrature phase signal QN2 for generating the third negative in-phase signal IN3. Herein, the first positive in-phase signal IP1 and the first negative in-phase signal IN1 are signals in which a magnitude is controlled by the second constant current source ISS2.

When the switches of the fourth group are turned on, the phase difference "∠Q−∠I" between the in-phase signal I (IP3 and IN3) and the quadrature phase signal Q (QP3 and QN3) that are generated in the phase signal generator 100 is 90 degrees. Herein, as the magnitude of the second positive quadrature phase signal QP2, the magnitude of the second positive in-phase signal IP2, the magnitude of the second negative quadrature phase signal QN2 or the magnitude of the second negative in-phase signal IN2 increases, a phase angle (for example, rotation phase angle) between the in-phase signal I (IP3 and IN3) and the quadrature phase signal Q (QP3 and QN3) gradually increases with respect to a Q axis. That is, the in-phase signal I (IP3 and IN3) and the quadrature phase signal Q (QP3 and QN3) rotate clockwise (i.e., right) about the Q axis on a vector graph. The in-phase signal I (IP3 and IN3) and the quadrature phase signal Q (QP3 and QN3) maintain a 90-degree phase difference.

However, the current values of the first and second variable current sources I1_DAC and I2_DAC may be set to 0 in response to the phase control signal DAC_CTRL. At this point, the phase signal generator 100 may generate phase signals (an in-phase signal and a quadrature phase signal) having a 90-degree phase difference. In this case, the in-phase signal I (IP3 and IN3) and the quadrature phase signal Q (QP3 and QN3) maintain a 90-degree phase difference and are in an unrotated state.

Figure 6:
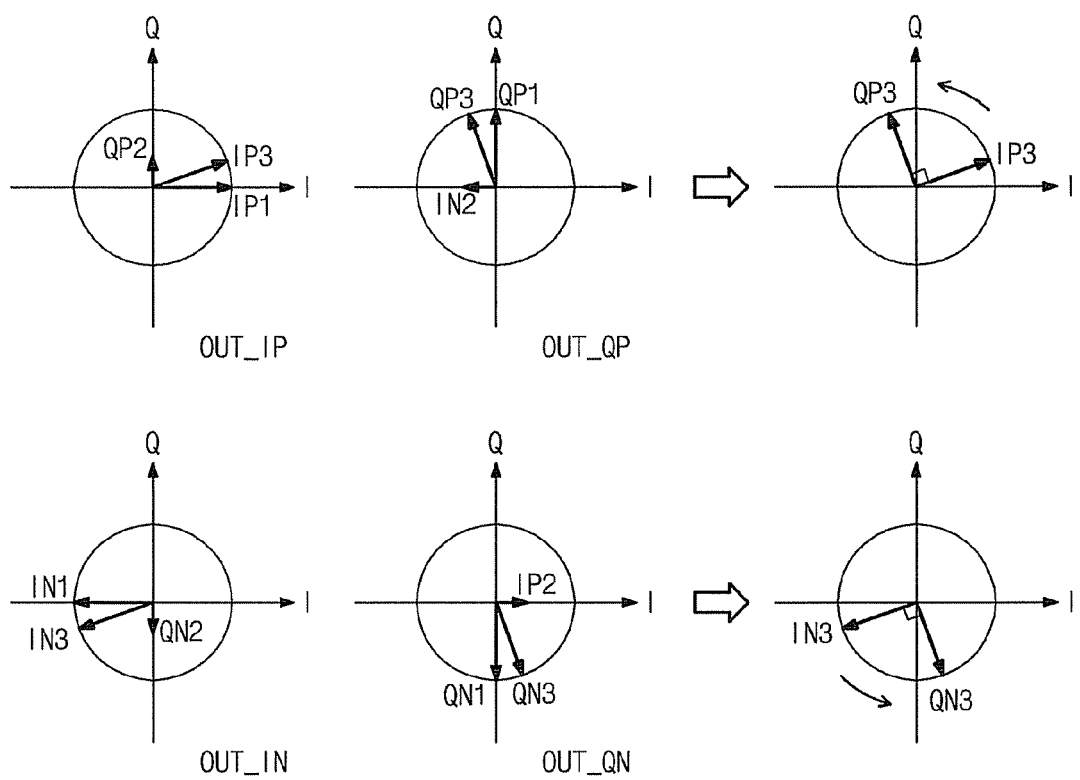
FIG. 6 is a diagram illustrating vector graphs of phase signals in the phase signal generator of FIG. 5 according to an example embodiment.

FIG. 6 is a diagram illustrating the vector graphs of phase signals when the PMOS transistors of the third group are turned-on in the phase signal generator which is exemplarily illustrated in FIG. 5.

Referring to FIG. 6, the output signals (the third positive in-phase signal IP3 and the third negative in-phase signal IN3 that are respectively outputted through the output ports (the positive in-phase signal output port OUT_IP and the negative in-phase signal output port OUT_IN) of the in-phase buffer 130 of the phase signal generator 100 and the output signals (the third positive quadrature phase signal QP3 and the third negative quadrature phase signal QN3) that are respectively outputted through the output ports (the positive quadrature phase signal output port OUT_QP and the negative quadrature phase signal output port OUT_QN) of the quadrature phase buffer 160 of the phase signal generator 100 are illustrated in the type of a vector (which includes the phase component of each signal).

First, the in-phase buffer 130 outputs the third positive in-phase signal IP3 through the positive in-phase signal output port OUT_IP. The in-phase buffer 130 mixes the first positive in-phase signal IP1 and the second positive quadrature phase signal QP2 for generating the third positive in-phase signal IP3.

Second, the quadrature phase buffer 160 outputs the third positive quadrature phase signal QP3 through the positive quadrature phase signal output port OUT_QP. The quadrature phase buffer 160 mixes the first positive quadrature phase signal QP1 and the second negative in-phase signal IN2 for generating the third positive quadrature phase signal QP3.

When the PMOS transistors S1, S4, S6 and S7 of the third group are turned on, the phase difference between the third positive in-phase signal IP3 and the third positive quadrature phase signal QP3 is 90 degrees (i.e., the third positive in-phase signal IP3 and the third positive quadrature phase signal QP3 are perpendicularly crossed).

Third, the in-phase buffer 130 outputs the third negative in-phase signal IN3 through the negative in-phase signal output port OUT_IN. The in-phase buffer 130 mixes the first negative in-phase signal IN1 and the second negative quadrature phase signal QN2 for generating the third negative in-phase signal IN3.

Fourth, the quadrature phase buffer 160 outputs the third negative quadrature phase signal QN3 through the negative quadrature phase signal output port OUT_QN. The quadrature phase buffer 160 mixes the first negative quadrature phase signal QN1 and the second positive in-phase signal IP2 for generating the third negative quadrature phase signal QN3.

When the PMOS transistors S1, S4, S6 and S7 of the third group are turned on, the phase difference between the third negative in-phase signal IN3 and the third negative quadrature phase signal QN3 is 90 degrees (i.e., the third negative in-phase signal IN3 and the third negative quadrature phase signal QN3 are perpendicularly crossed).

Herein, the third positive in-phase signal IP3 and the third positive quadrature phase signal QP3 (or, the third negative in-phase signal IN3 and the third negative quadrature phase signal QN3) rotate by a phase angle about an I axis according to the magnitude of the second positive quadrature phase signal QP2 and the magnitude of the second negative quadrature phase signal QN2 (or, the magnitude of the second positive in-phase signal IP2 and the magnitude of the second negative in-phase signal IN2).

Figure 7:
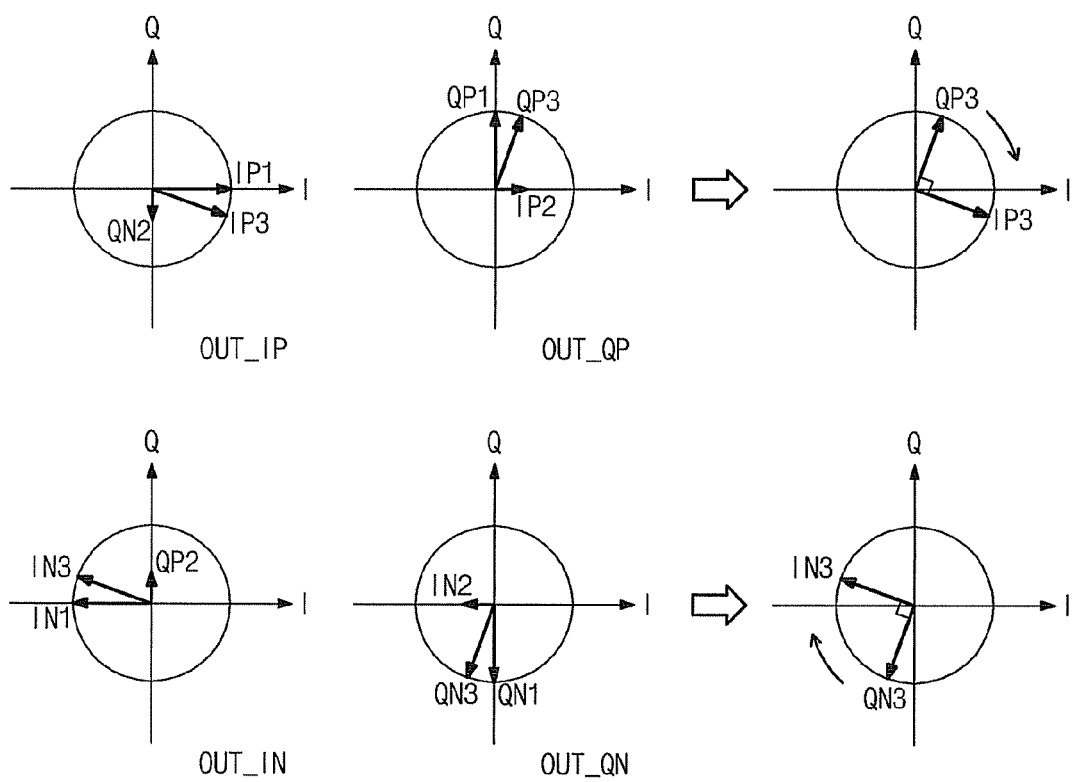
FIG. 7 is a diagram illustrating vector graphs of phase signals in the phase signal generator of FIG. 5 according to an example embodiment.

FIG. 7 is a diagram illustrating the vector graphs of phase signals when the PMOS transistors of the fourth group in the phase signal generator which is exemplarily illustrated in FIG. 5 are turned-on.

Referring to FIG. 7, the output signals (the third positive in-phase signal IP3 and the third negative in-phase signal IN3 that are respectively outputted through the output ports (the positive in-phase signal output port OUT_IP and the negative in-phase signal output port OUT_IN) of the in-phase buffer 130 of the phase signal generator 100 and the output signals (the third positive quadrature phase signal QP3 and the third negative quadrature phase signal QN3) that are respectively outputted through the output ports (the positive quadrature phase signal output port OUT_QP and the negative quadrature phase signal output port OUT_QN) of the quadrature phase buffer 160 of the phase signal generator 100 are illustrated in a vector type.

First, the in-phase buffer 130 outputs the third positive in-phase signal IP3 through the positive in-phase signal output port OUT_IP. The in-phase buffer 130 mixes the first positive in-phase signal IP1 and the second negative quadrature phase signal QN2 for generating the third positive in-phase signal IP3.

Second, the quadrature phase buffer 160 outputs the third positive quadrature phase signal QP3 through the positive quadrature phase signal output port OUT_QP. The quadrature phase buffer 160 mixes the first positive quadrature phase signal QP1 and the second positive in-phase signal IP2 for generating the third positive quadrature phase signal QP3.

When the switches of the fourth group are turned on, the phase difference between the third positive in-phase signal IP3 and the third positive quadrature phase signal QP3 is 90 degrees (i.e., the third positive in-phase signal IP3 and the third positive quadrature phase signal QP3 are perpendicularly crossed).

Third, the in-phase buffer 130 outputs the third negative in-phase signal IN3 through the negative in-phase signal output port OUT_IN. The in-phase buffer 130 mixes the first negative in-phase signal IN1 and the second positive quadrature phase signal QP2 for generating the third negative in-phase signal IN3.

Fourth, the quadrature phase buffer 160 outputs the third negative quadrature phase signal QN3 through the negative quadrature phase signal output port OUT_QN. The quadrature phase buffer 160 mixes the first negative quadrature phase signal QN1 and the second negative in-phase signal IN2 for generating the third negative quadrature phase signal QN3.

When the switches of the fourth group are turned on, the phase difference between the third negative in-phase signal IN3 and the third negative quadrature phase signal QN3 is 90 degrees (i.e., the third negative in-phase signal IN3 and the third negative quadrature phase signal QN3 are perpendicularly crossed).

Herein, the third positive in-phase signal IP3 and the third positive quadrature phase signal QP3 (or, the third negative in-phase signal IN3 and the third negative quadrature phase signal QN3) rotate by a phase angle about a Q axis according to the magnitude of the second positive quadrature phase signal QP2 and the magnitude of the second negative quadrature phase signal QN2 (or, the magnitude of the second positive in-phase signal IP2 and the magnitude of the second negative in-phase signal IN2).

As illustrated in FIGS. 5 through 7, the phase signal generator 100 generates phase signals (an in-phase signal and a quadrature phase signal) having a rotated phase in a state where a 90-degree phase angle is maintained between the in-phase signal and the quadrature phase signal.

The phase signal generator 100 for generating phase signals having a rotated phase angle may be used for an antenna beam forming system by being multiplied in a communication system.

In example embodiments of inventive concepts, accordingly, the communication system can generate phase signals having various phase differences between the phase signals or phase signals that maintain a rotated phase angle in a state that maintains a 90-degree phase difference, through the phase signal generator 100.

Figure 8:
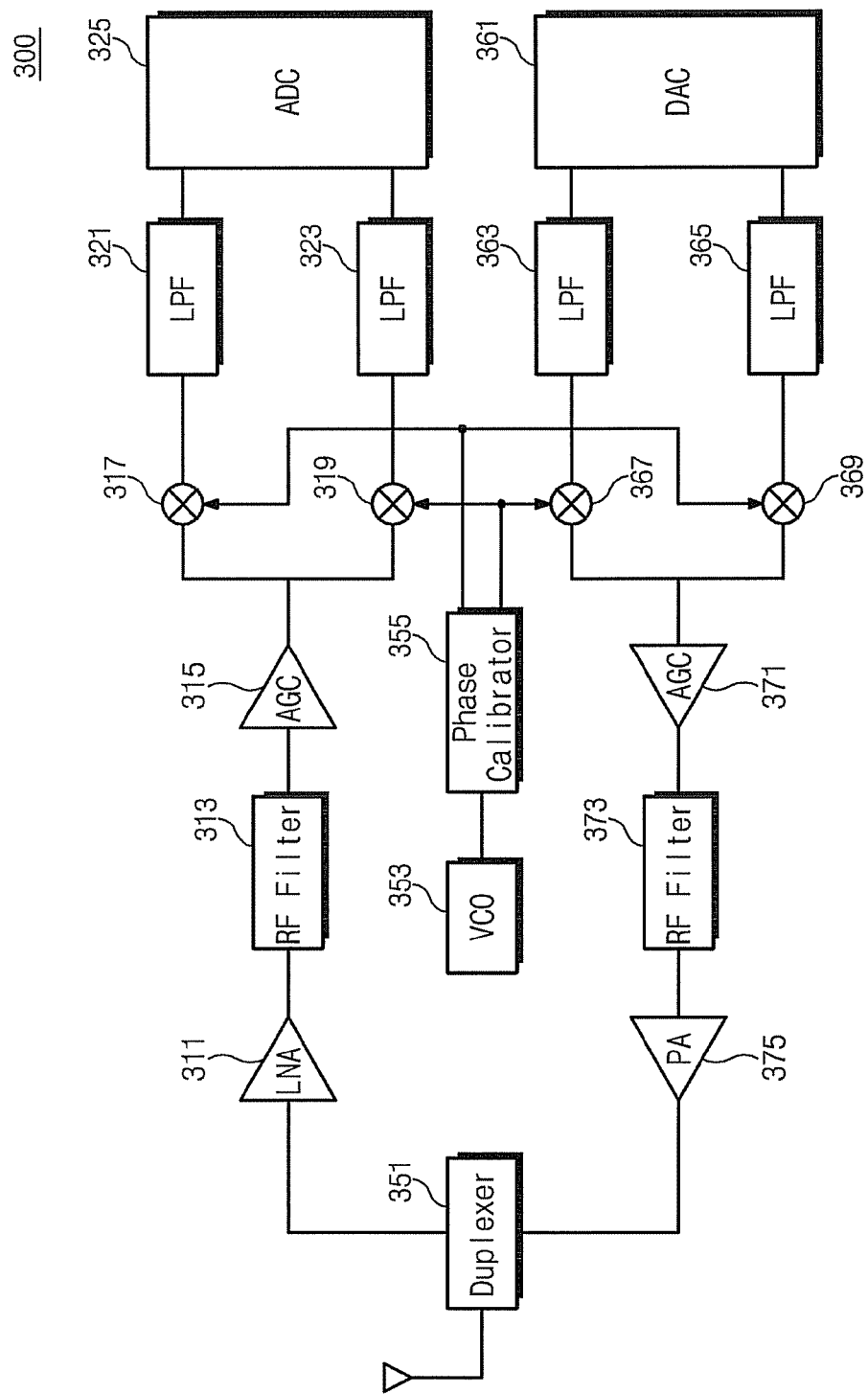
FIG. 8 is a diagram illustrating a transmitter-receiver according to an example embodiment of inventive concepts.

FIG. 8 is a diagram illustrating the structure of a transmitter-receiver applying the phase signal generating apparatus according to an example embodiment of inventive concepts.

Referring to FIG. 8, a transmitter-receiver 300 according to an example embodiment of inventive concepts includes a Low Noise Amplifier (LNA) 311, a Radio Frequency (RF) filter 313, an Automatic Gain Controller (AGC) 315, a first mixer 317, a second mixer 319, a first Low Pass Filter (LPF) 321, a second low pass filter 323, an analog-to-digital converter (ADC) 325, a duplexer 351, a Voltage Control Oscillator (VCO) 353, a phase calibrator 355, a digital-to-analog converter (DAC) 361, a third low pass filter 363, a fourth low pass filter 365, a third mixer 367, a fourth mixer 369, an automatic gain controller 371, an RF filter 373, and a Power Amplifier (PA) 375.

The duplexer 351 transmits/receives a signal through an antenna. The duplexer 351 outputs the received signal to the low noise amplifier 311. The duplexer 351 transmits a transmission signal, which is outputted from the power amplifier 375, through the antenna. The duplexer 351 breaks the transmitting of a signal for receiving a signal. The duplexer 351 breaks the receiving of a signal for transmitting a signal.

First, the signal receiving operation of the transmitter-receiver 300 is as follows.

The low noise amplifier 311 low-noise amplifies a reception signal, which is outputted from the duplexer 351, at a predetermined amplification rate. The RF filter 313 filters the reception signal of a specific frequency band among receptions signals that are low-noise amplified in the low noise amplifier 311. The automatic gain controller 313 automatic gain-controls a reception signal that is filtered through the RF filter 313.

The voltage control oscillator 353 generates a Local Oscillation (LO) signal by controlling a voltage. The phase calibrator 355 controls the phase of the LO signal, i.e., the phase of an in-phase signal and the phase of a quadrature phase signal, which is outputted from the voltage control oscillator 353 to output the phase-controlled LO signal.

The first mixer 317 multiplies the reception signal that is automatic gain-controlled in the automatic gain controller 313 and the in-phase signal that is generated in the phase calibrator 355. The first low pass filter 321 low-pass filters a reception signal that is outputted in the first mixer 317. The second mixer 319 multiplies the reception signal (the automatic gain-controlled signal) and the quadrature phase signal. The second low pass filter 323 low-pass filters a reception signal multiplied by the quadrature phase signal.

The A/D converter 325 converts reception signals that are low-pass filtered into digital signals.

Next, the signal transmitting operation of the transmitter-receiver 300 is as follows.

The D/A converter 361 converts a transmission signal into an analog signal. The third low pass filter 363 low-pass filters a transmission signal that is converted into an analog signal in the D/A converter 361. The fourth low pass filter 365 low-pass filters a transmission signal that is converted into an analog signal in the D/A converter 361.

The voltage control oscillator 353 generates an LO signal by controlling a voltage. The phase calibrator 355 controls the phase of the LO signal, i.e., the phase of an in-phase signal and the phase of a quadrature phase signal to output the phase-controlled LO signal.

The third mixer 367 multiplies the transmission signal that is outputted in the third low pass filter 363 and the in-phase signal that is outputted in the phase calibrator 355. The fourth mixer 369 multiplies the transmission signal (the low pass-filtered signal) and the quadrature phase signal that is outputted in the phase calibrator 355.

The second automatic gain controller 371 automatic gain-controls a transmission signal in which the in-phase signal and the quadrature phase signal are multiplied through each of the third and fourth mixers 367 and 369. The RF filter 373 filters the transmission signal of a specific frequency band from the automatic gain-controlled transmission signal. The power amplifier 375 power-amplifies the filtered transmission signal to transmit the power-amplified signal through the duplexer 351.

The phase calibrator 355 includes the phase signal generator 100 (or the phase signal generating apparatus) according to example embodiments of inventive concepts. At this point, the transmitter-receiver 300 compensates phase imbalance as follows.

The controller (not shown) of the transmitter-receiver 300 measures phase difference between reception signals in which the in-phase signal and the quadrature phase signal are mixed in each of the third and fourth mixers 367 and 369. Moreover, the controller measures phase difference between reception signals in which the in-phase signal and the quadrature phase signal are mixed in each of the first and second mixers 317 and 319.

The controller generates phase information on an in-phase signal and a quadrature phase signal in which phase imbalance may be compensated. The phase information includes phase difference information between the in-phase signal and the quadrature phase signal.

The controller provides the generated phase information to the phase controller 200. The phase controller 200 generates the switch control signal SW_CTRL and the phase control signal DAC_CTRL on the basis of the phase information. The controller may include the phase controller 200.

When phase difference (which is measured in the controller) between phase signals exceeds 90 degrees, the phase controller 200 generates the switch control signal SW_CTRL (for example, the first group PMOS transistor control signal IN_ANG having a high level) for turning on the switches of the first group. Moreover, the phase controller 200 generates the switch control signal SW_CTRL (for example, the second group PMOS transistor control signal EX_ANG having a low level) for turning off the switches of the second group. Accordingly, the phase controller 200 can compensate phase signals having a 90 or more-degree phase difference into phase signals having a 90-degree phase difference.

To the contrary, when phase difference (which is measured in the controller) between phase signals is less than 90 degrees, the phase controller 200 generates the switch control signal SW_CTRL (for example, the first group PMOS transistor control signal IN_ANG having a low level) for turning off the switches of the first group. Moreover, the phase controller 200 generates the switch control signal SW_CTRL (for example, the second group PMOS transistor control signal EX_ANG having a high level) for turning on the switches of the second group. Accordingly, the phase controller 200 can compensate phase signals having a phase difference less than 90 degrees into phase signals having a 90-degree phase difference.

The phase controller 200 generates the phase control signal DAC_CTRL that controls the current values of the variable current sources I1_DAC and I2_DAC, for setting a phase difference between phase signals.

Moreover, when phase difference (which is measured in the controller) between phase signals is 90 degrees, the phase controller 200 performs controlling for the current values of the variable current sources I1_DAC and I2_DAC to become 0. At this point, the phase controller 200 may generate the switch control signal SW_CTRL for turning on the switches of the first group or the switches of the second group. Moreover, the phase controller 200 may not generate the switch control signal SW_CTRL.

The phase controller 200 provides the switch control signal SW_CTRL and the phase control signal DAC_CTRL to the phase signal generator 100.

The phase signal generator 100 generates the quadrature phase signals IP3 and IN3 and the in-phase signals QP3 and QN3 according to the switch control signal SW_CTRL and the phase control signal DAC_CTRL. The phase signal generator 100 selects one from among the PMOS transistors of the first group and the PMOS transistors of the second group and generates phase signals. The phase signals include the quadrature phase signals IP3 and IN3 and the in-phase signals QP3 and QN3.

The phase calibrator 355 provides the quadrature phase signals IP3 and IN3 and the in-phase signals QP3 and QN3, which are generated in the phase signal generator 100, to the first to fourth mixers 317, 319, 367 and 369.

Then, phase imbalance between the in-phase signal and the quadrature phase signal in the transmitter-receiver 300 may be compensated.

The phase calibrator 355 includes the phase signal generating apparatus in FIG. 1 and may compensate phase imbalance. At this point, the phase signal generating apparatus may include the phase signal generator in FIG. 2.

As an example, moreover, the phase signal generating apparatus including the phase signal generator in FIG. 5 may be used as a phase converter for forming the beam of a transmitter. At this point, the phase signal generating apparatus generates a phase signal corresponding to the beam forming direction of the transmitter.

Therefore, the phase signal generating apparatus according to example embodiments of inventive concepts may be applied to various devices and generate a phase signal.

According to example embodiments of inventive concepts, the phase signal generating apparatus controls the phase between the in-phase signal and the quadrature phase signal in the communication system, thereby compensating phase imbalance.

The above-disclosed subject matter is to be considered illustrative and not restrictive, and the appended claims are intended to cover all such modifications, enhancements, and other example embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A phase signal generating apparatus, comprising:
a phase signal generator configured to receive a plurality of first phase signals and a plurality of second phase signals, adjust a phase difference between the plurality of first phase signals and the plurality of second phase signals and generate a plurality of adjusted first phase signals and a plurality of adjusted second phase signals, based on a switch control signal and a phase control signal, a phase difference between the plurality of adjusted first phase signals and the plurality of adjusted second phase signals being the adjusted phase difference; and
a phase controller configured to generate the switch control signal and the phase control signal based on phase information for the plurality of first phase signals and the plurality of second phase signals, wherein the phase signal generator includes,
a switch unit configured to selectively apply the plurality of phase signals to a phase control unit in response to the switch control signal,
the phase control unit configured to receive the selectively applied plurality of second phase signals, control magnitudes of the selectively applied plurality of second phase signals and generate a plurality of third phase signals in response to the phase control signal and the selectively applied plurality of second phase signals, and
a phase buffer configured to mix the plurality of first phase signals with the plurality of third phase signals and output the plurality of adjusted first phase signals based on the mixed plurality of first phase signals and plurality of third phase signals.

2. The phase signal generating apparatus of claim 1, wherein the plurality of adjusted first phase signals has a 90-degree phase difference with respect to the plurality of adjusted second phase signals.

3. The phase signal generating apparatus of claim 2, wherein:
if the plurality of first phase signals are a first positive in-phase signal and a first negative in-phase signal, the plurality of second phase signals are a first positive quadrature phase signal and a first negative quadrature phase signal, and
if the plurality of first phase signals is the first positive quadrature phase signal and the first negative quadrature phase signal, the plurality of second phase signals are the first positive in-phase signal and the first negative in-phase signal.

4. The phase signal generating apparatus of claim 2, wherein the switch unit comprises:
a first switch unit including,
a first switch configured to selectively apply a first positive quadrature phase signal to be mixed with a first positive in-phase signal in response to the switch control signal,
a second switch configured to selectively apply a first positive quadrature phase signal to be mixed with a first negative in-phase signal in response to the switch control signal,
a third switch configured to selectively apply a first negative quadrature phase signal to be mixed with a first positive in-phase signal in response to the switch control signal, and
a fourth switch configured to selectively apply a first negative quadrature phase signal to be mixed with a first negative in-phase signal in response to the switch control signal; and
a second switch unit including,
a fifth switch configured to selectively apply the first positive in-phase signal to be mixed with the first positive quadrature phase signal in response to the switch control signal,
a sixth switch configured to selectively apply the first positive in-phase signal to be mixed with the first negative in-phase signal in response to the switch control signal,
a seventh switch configured to selectively apply the first negative in-phase signal to be mixed with the first positive quadrature phase signal in response to the switch control signal, and
an eighth switch configured to selectively apply the first negative in-phase signal to be mixed with the first positive in-phase signal in response to the switch control signal.

5. The phase signal generating apparatus of claim 4, wherein the phase control unit comprises:
a first phase control unit including,
a first variable current source configured to output a current in response to the phase control signal,
a first NMOS transistor having a gate connected to the first and third switches, the first NMOS transistor being configured to generate, based on the current output by the first variable current source, a second positive quadrature phase signal if the first NMOS transistor receives the first positive quadrature phase signal and a second negative quadrature phase signal if the first NMOS transistor receives the first negative quadrature phase signal, and a second NMOS transistor having a gate connected to the second and fourth switches, the second NMOS transistor being configured to generate, based on the current output by the first variable current source, the second positive quadrature phase signal if the second NMOS transistor receives the first positive quadrature phase signal and the second negative quadrature phase signal if the second NMOS transistor receives the first negative quadrature phase signal; and a second phase control unit including,
a second variable current source configured to output a current in response to the phase control signal,
a third NMOS transistor having a gate connected to the fourth and seventh switches, the third NMOS transistor being configured to generate, based on the current output by the second variable current source, a second positive in-phase signal if the third NMOS transistor receives the first positive in-phase signal and a second negative in-phase signal if the third NMOS transistor receives the first negative in-phase signal, and
a fourth NMOS transistor having a gate connected to the fifth and eighth switches, the fourth NMOS transistor being configured to generate, based on the current output by the second variable current source, the second positive in-phase signal if the fourth NMOS transistor receives the first positive in-phase signal and the second negative quadrature phase signal if the fourth NMOS transistor receives the first negative quadrature phase signal.

6. The phase signal generating apparatus of claim 5, wherein the phase buffer comprises:
an in-phase buffer including,
a first path system configured to mix the first positive in-phase signal with one of the second positive quadrature phase signal and the second negative quadrature phase signal and configured to generate a third positive in-phase signal based on the first positive in-phase signal and the one of the second positive quadrature phase signal and the second negative quadrature and
a second path system configured to mix the first negative in-phase signal with one of the second positive quadrature phase signal and the second negative quadrature phase signal and configured to generate a third negative in-phase signal based on the first negative in-phase signal and the one of the second positive quadrature phase signal and the second negative quadrature phase signal; and
a quadrature phase buffer including,
a third path system configured to mix the first positive quadrature phase signal with one of the second positive in-phase signal and the second negative in-phase signal and configured to generate a third positive quadrature phase signal based on the first positive quadrature phase signal and the one of the second positive in-phase signal and the second negative in-phase signal, and
a fourth path system configured to mix the first negative quadrature phase signal with one of the second positive in-phase signal and the second negative in-phase signal and configured to generate a third negative quadrature phase signal based on the first negative quadrature phase signal and the one of the second positive in-phase signal and the second negative in-phase signal.

7. The phase signal generating apparatus of claim 6, wherein the phase signal generator is configured to activate the first switch, the fourth switch, the sixth switch and the seventh switch based on the switch control signal, control a phase difference between the third positive in-phase signal and the third positive quadrature phase signal to be less than 90 degrees based on the switch control signal, and control a phase difference between the third negative in-phase signal and the third negative quadrature phase signal to be less than 90 degrees based on the switch control signal.

8. The phase signal generating apparatus of claim 6, wherein the phase signal generator is configured to activate the second switch, the third switch, the sixth switch and the seventh switch based on the switch control signal, control a phase difference between the third positive in-phase signal and the third positive quadrature phase signal to be greater than 90 degrees based on the switch control signal, and control a phase difference between the third negative in-phase signal and the third negative quadrature phase signal to be greater than 90 degrees based on the switch control signal.

9. The phase signal generating apparatus of claim 6, wherein the phase signal generator is configured to activate the first switch, the fourth switch, the sixth switch and the seventh switch based on the switch control signal, and control a phase difference between each of the third positive in-phase signal, the third positive quadrature phase signal, the third negative in-phase signal and the third negative quadrature phase signal to be 90 degrees and to be rotated left with respect to an in-phase axis based on the switch control signal.

10. The phase signal generating apparatus of claim 6, wherein the phase signal generator is configured to activate the second switch, the third switch, the fifth switch and the eighth switch based on the switch control signal, and control a phase difference between each of the third positive in-phase signal, the third positive quadrature phase signal, the third negative in-phase signal and the third negative quadrature phase signal to be 90 degrees and to be rotated right with respect to a quadrature phase axis based on the switch control signal.

* * * * *